(12) United States Patent
Liu et al.

(10) Patent No.: US 9,837,366 B1
(45) Date of Patent: Dec. 5, 2017

(54) SEMICONDCUTOR STRUCTURE AND SEMICONDUCTOR MANUFACTURING PROCESS THEREOF

(71) Applicant: Taiwan Semiconductor Manufacturing Co., Ltd., Hsinchu (TW)

(72) Inventors: Chen-Hsun Liu, Tainan (TW); Chin-Yu Ku, Hsinchu (TW); Rung-De Wang, Kaohsiung (TW); Wei-Lun Hsieh, Tainan (TW); Chia-Hua Wang, Hsinchu (TW); Jheng-Hong Chen, Hsinchu (TW); Pei-Shing Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/390,519

(22) Filed: Dec. 25, 2016

Related U.S. Application Data

(60) Provisional application No. 62/427,139, filed on Nov. 28, 2016.

(51) Int. Cl.
| | | |
|---|---|---|
| *H01L 23/544* | (2006.01) | |
| *H01L 23/58* | (2006.01) | |
| *H01L 23/00* | (2006.01) | |
| *H01L 21/78* | (2006.01) | |
| *H01L 21/3213* | (2006.01) | |

(52) U.S. Cl.
CPC ...... *H01L 23/585* (2013.01); *H01L 21/32133* (2013.01); *H01L 21/78* (2013.01); *H01L 23/562* (2013.01)

(58) Field of Classification Search
CPC ...... H01L 23/585; H01L 23/562; H01L 21/78
USPC ........................................................ 257/622
See application file for complete search history.

(56) References Cited

U.S. PATENT DOCUMENTS

| | | | | |
|---|---|---|---|---|
| 7,453,128 | B2* | 11/2008 | Tsutsue | ................ H01L 23/564 257/409 |
| 7,728,418 | B2* | 6/2010 | Nomura | ................ H01L 23/564 257/685 |
| 8,361,842 | B2 | 1/2013 | Yu et al. | |
| 8,680,647 | B2 | 3/2014 | Yu et al. | |
| 8,703,542 | B2 | 4/2014 | Lin et al. | |
| 8,759,964 | B2 | 6/2014 | Pu et al. | |
| 8,778,738 | B1 | 7/2014 | Lin et al. | |
| 8,785,299 | B2 | 7/2014 | Mao et al. | |
| 8,803,306 | B1 | 8/2014 | Yu et al. | |
| 8,809,996 | B2 | 8/2014 | Chen et al. | |
| 8,829,676 | B2 | 9/2014 | Yu et al. | |
| 8,877,554 | B2 | 11/2014 | Tsai et al. | |
| 8,970,007 | B2* | 3/2015 | Wada | ................... H01L 23/562 257/620 |

(Continued)

*Primary Examiner* — Luan C Thai
(74) *Attorney, Agent, or Firm* — JCIPRNET

(57) ABSTRACT

A semiconductor structure has a semiconductor device, a first seal ring, and a second seal ring. The semiconductor device has a first surface and a second surface opposite to the first surface. The first seal ring is disposed on the first surface of the semiconductor device and adjacent to edges of the first surface. The second seal ring is disposed on the second surface of the semiconductor device and adjacent to edges of the second surface. A semiconductor manufacturing process is also provided.

20 Claims, 18 Drawing Sheets

(56) References Cited

U.S. PATENT DOCUMENTS

| | | |
|---|---|---|
| 2010/0244199 A1* | 9/2010 | Sakuma .................. H01L 21/78 257/618 |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

* cited by examiner

SEMICONDCUTOR STRUCTURE AND SEMICONDUCTOR MANUFACTURING PROCESS THEREOF

CROSS-REFERENCE TO RELATED APPLICATION

This application claims the priority benefits of U.S. provisional application Ser. No. 62/427,139, filed on Nov. 28, 2016. The entirety of the above-mentioned patent application is hereby incorporated by reference herein and made a part of this specification.

BACKGROUND

Integrated circuits are used in a variety of electronic applications, such as personal computers, cell phones, digital cameras, and other electronic equipment. Integrated circuits are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be singulated to be packaged at wafer level. Seal ring formation is an important part in the back-end of line semiconductor processes. Seal rings are stress protection structures around integrated circuits, protecting the internal circuit inside semiconductor chips from damage caused by the dicing of the dies from wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
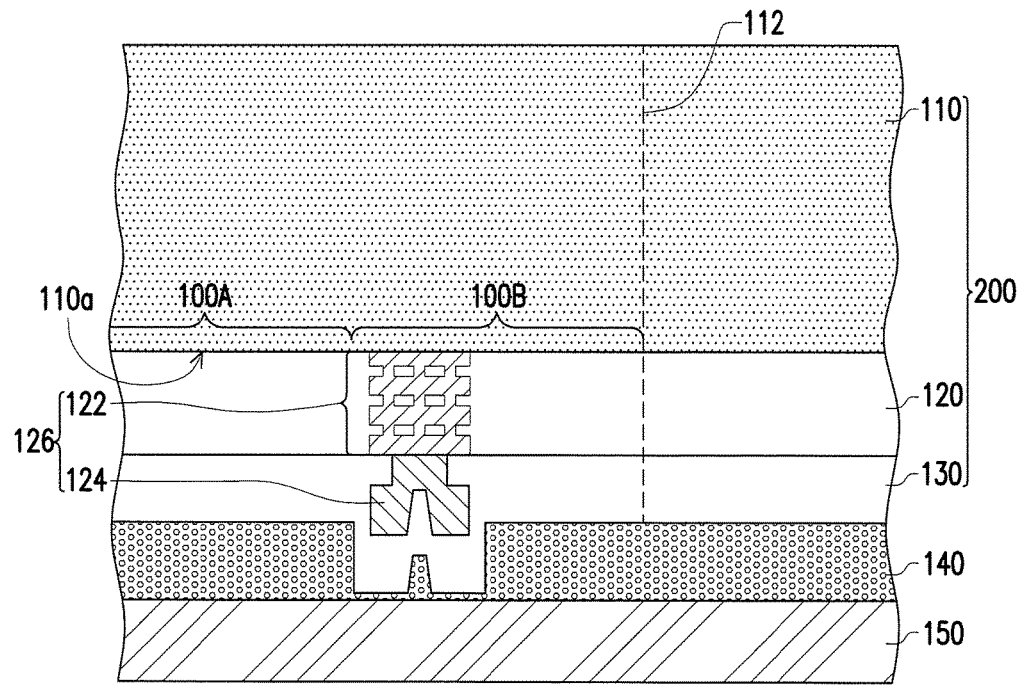
FIG. 1A to FIG. 1G are schematic cross sectionals of various stages in a semiconductor manufacturing process of a semiconductor structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are schematic cross sectionals of various stages in a semiconductor manufacturing process of a semiconductor structure according to some exemplary embodiments of the present disclosure. Referring to FIG. 1A, a wafer 100 is provided. The wafer 100 includes a plurality of semiconductor devices 110 formed in a semiconductor substrate. In FIG. 1A, only one semiconductor device 110 is shown in FIG. 1A for illustration. The semiconductor device 110 is manufactured through a front end of line (FEOL) process, and includes devices such as active devices (e.g., diodes and/or transistors), passive devices (e.g., capacitors and/or resistors), etc. The devices are formed in an active region 100A of the semiconductor device 110.

Furthermore, an interconnection layer 120 is formed on the semiconductor devices 110 of the wafer 100. The interconnection layer 120 is formed by dielectric material layers and metallization layers layer by layer. In some embodiments, the interconnection layer 120 may include more or less than the number of dielectric material layers shown in FIG. 1A. In alternative embodiments, the interconnection layer 120 may include more or less than the number of metallization layers shown. The number of metallization layers and the number of dielectric material layers may be adjusted depending on the routing requirement of the respective semiconductor structure. The material of the dielectric material layers in the interconnection layer 120 includes polymer, polymide, benzocyclobutene (BCB), polybenzoxazole (PBO), or any other suitable dielectric material. The material of the metallization layers in the interconnection layer 120 includes aluminum, titanium, copper, nickel, tungsten, and/or alloys thereof, but is not limited by the above-mentioned materials.

Further referring to FIG. 1A, in some embodiments, the interconnection layer 120 includes a seal ring structure 122. The seal ring structure 122 is formed from the dielectric material layers and metallization layers layer by layer as described above. Other portions of the interconnection layer 120 may include interconnect structures not shown for other routing requirements of the devices formed in the active region 100A of the semiconductor device 110. The seal ring structure 122 is formed on the periphery region 100B of the semiconductor device 110. The periphery region 100B of the semiconductor device 110 does not include the devices usually. The periphery region 100B surrounds the active region 100A. The seal ring structure 122 is part of a first seal ring 126, and may be formed with the interconnect structures in the interconnection layer 120, or be formed independently of the interconnect structures in the interconnection layer 120.

Further referring to FIG. 1A, in some embodiments, a top metal layer 124 is formed with the interconnection layer 120, and is formed on the seal ring structure 122. The top metal layer 124 and the seal ring structure 122 are connected to form the first seal ring 126 on the first surface 110a of the semiconductor device 110. The first seal ring 126 is disposed on the first surface 110a of the semiconductor device 110. The first seal ring 126 is in the periphery region 100B of the semiconductor device 110. In some embodiments, the first seal ring 126 is electrically floated, or electrically grounded. Furthermore a passivation layer 130 is formed on the interconnection layer 120, and covers the top metal layer 124. The passivation layer 130 and the interconnection layer 120 are formed through any suitable back end of line (BEOL) process. The description of the material of the passivation layer 130 can be referred to the material of the dielectric material layers in the interconnection layer 120.

As seen in FIG. 1A, the wafer 100 is provided on a carrier 150, and an adhesive layer 140 is disposed between the wafer 100 and the carrier 150. The adhesive layer 140 is any material suitable for bonding the wafer 100 onto the carrier 150. The adhesive layer 140 may be an adhesive tape, adhesive glue, or any other suitable material. The disclosure is not limited thereto. Furthermore, the front side of the wafer 100 is adhered on the carrier 150. That is to say, the wafer 100 is face down in the carrier 150, and the back side of the wafer 100 is facing up. Thus, the back side of the wafer 100 can be processed. The wafer 100 also includes a plurality of scribe lines 112 (only one is shown), for where the wafer 100 is to be diced or sawed during the wafer singulation process.

Figure 1B:
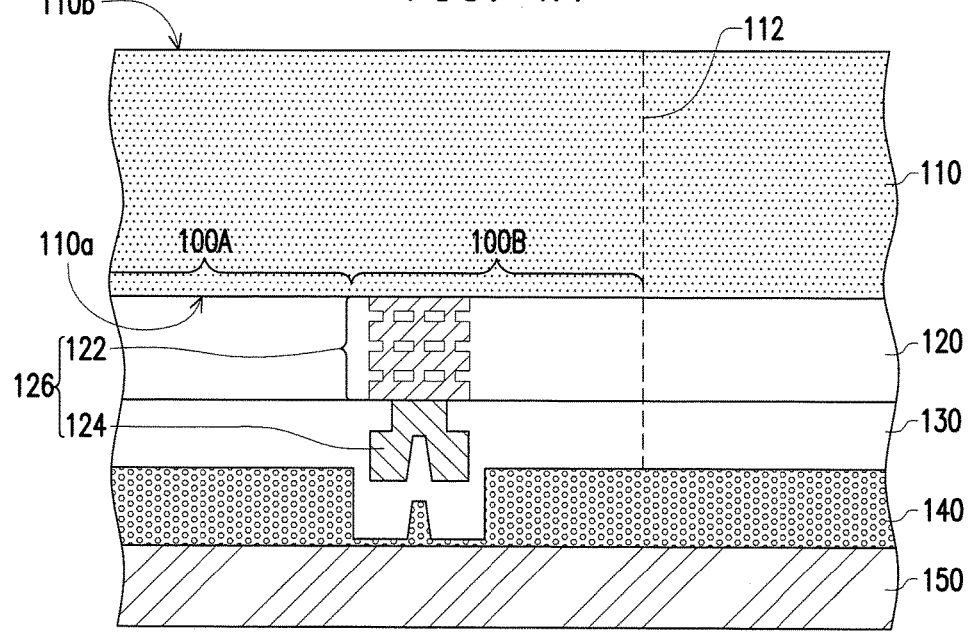

Next, as seen in FIG. 1B, in some embodiments, the wafer 100 is thinned. As a result, material is removed from the semiconductor device 110 such that the semiconductor device 110 is thinned. The wafer 100 is thinned through any suitable wafer backside thinning process such as mechanical grinding, chemical mechanical polishing (CMP), wet etching and atmospheric downstream plasma (ADP) dry chemical etching (DCE) or combinations thereof, but is not limited by the above-mentioned processes. The wafer thinning process reduces a thickness of the semiconductor device 110 to a second surface 110b of the semiconductor device 110.

Figure 1C:
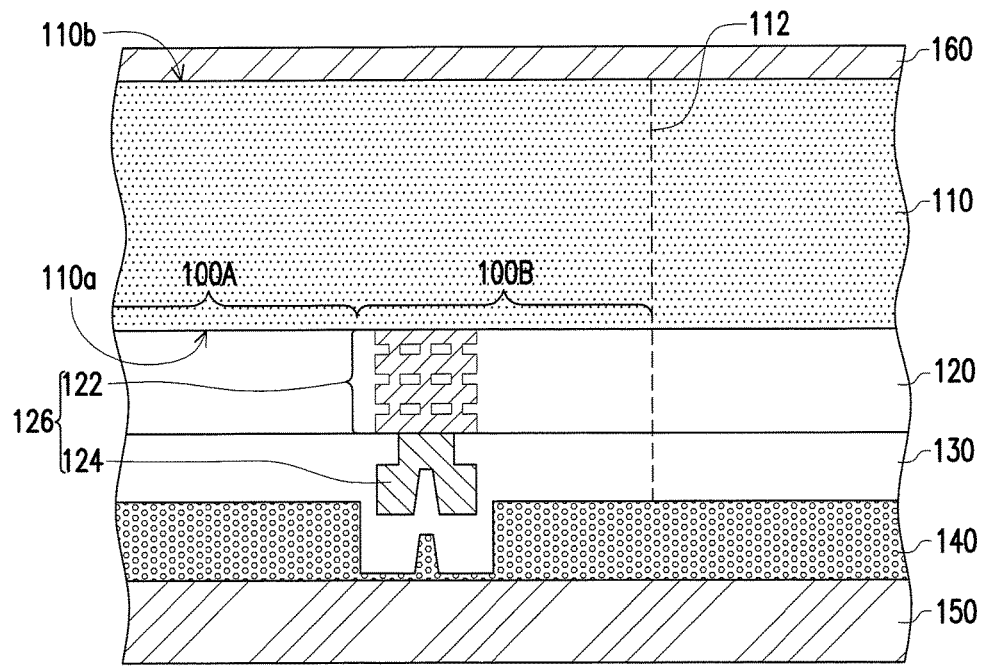

Next, referring to FIG. 1C, in some embodiments, a conductive layer 160 is formed on the second surface 110b of the semiconductor device 110. The conductive layer 160 is formed by, for example, deposition, sputtering, electroplating, or any other suitable method. A material of the conductive layer 160 includes aluminum, titanium, copper, nickel, tungsten, and/or alloys thereof, but is not limited by the above-mentioned materials.

Figure 1D:
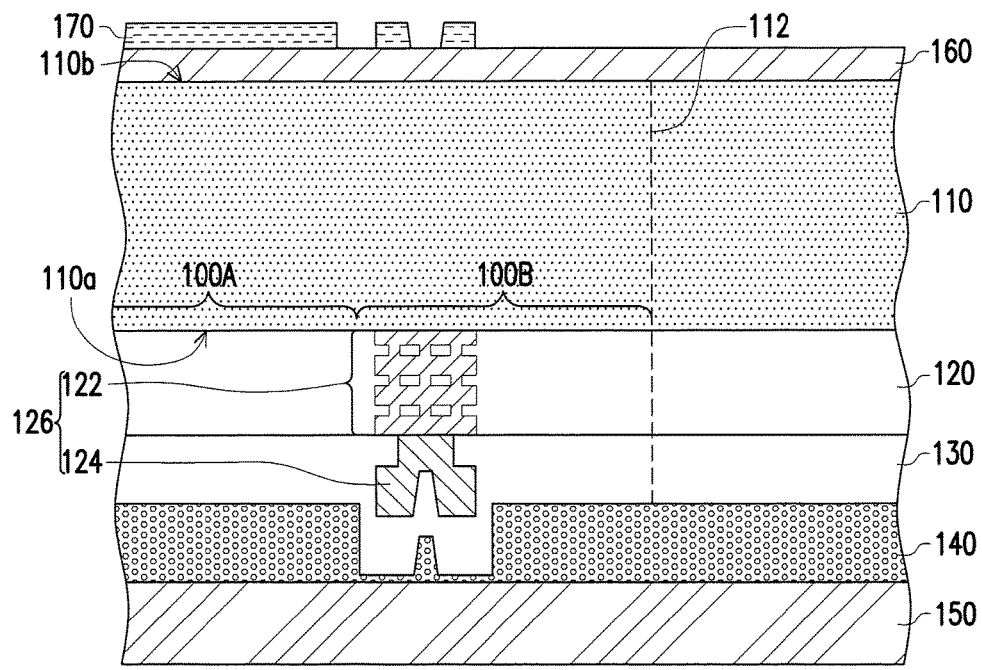

Next, referring to FIG. 1D, in some embodiments, a patterned photoresist layer 170 is formed on the conductive layer 160. In some embodiments, the patterned photoresist layer 170 is formed by forming a photoresist layer through spin coating and then patterning by projecting light through a photo mask (not shown). The material of the photoresist layer 170 is any suitable photosensitive material used during the photolithography process.

Figure 1E:
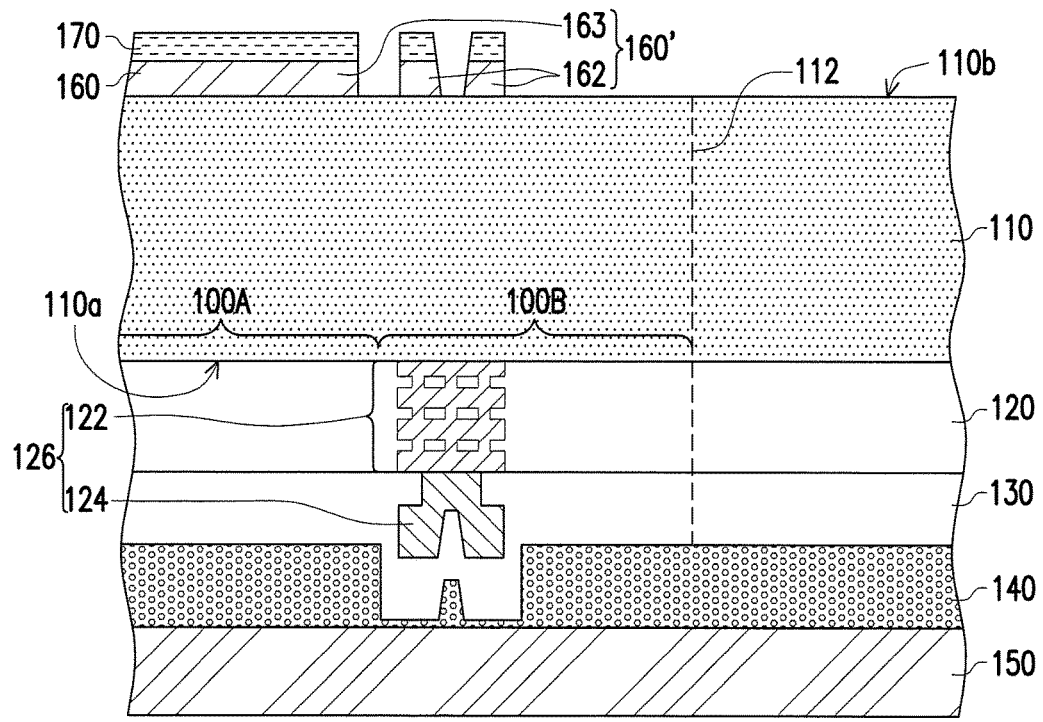
Figure 1F:
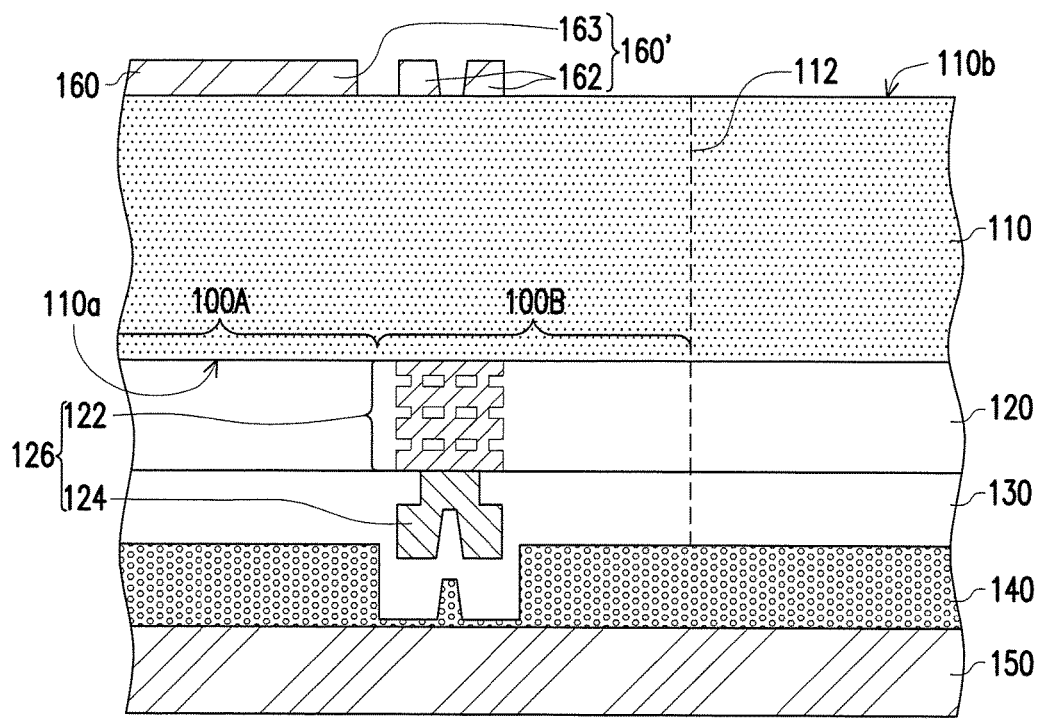

Referring to FIG. 1E, in some embodiments, the patterned photoresist layer 170 is used as the etch mask, and an etching process is performed towards the conductive layer 160 to pattern the conductive layer 160. The patterning of the conductive layer 160 forms a second seal ring 162. In some embodiments, the conductive layer 160 is also patterned for forming the required backside metal routing 163 on the semiconductor device 110 of the wafer 100. That is to say, the backside metal routing 163 and the second seal ring 162 are formed in the etching process in FIG. 1E. The backside metal routing 163 of the patterned conductive layer 160' is formed through patterning in the active region 100A of the semiconductor device 110, and the second seal ring 162 is formed in the periphery region 100B of the semiconductor device 110. In some embodiments, the second seal ring 162 is electrically floated, or electrically grounded. Then in FIG. 1F, in some embodiments, the patterned photoresist layer 170 is stripped and removed. The patterned photoresist layer 170 is removed through any suitable process.

Figure 1G:
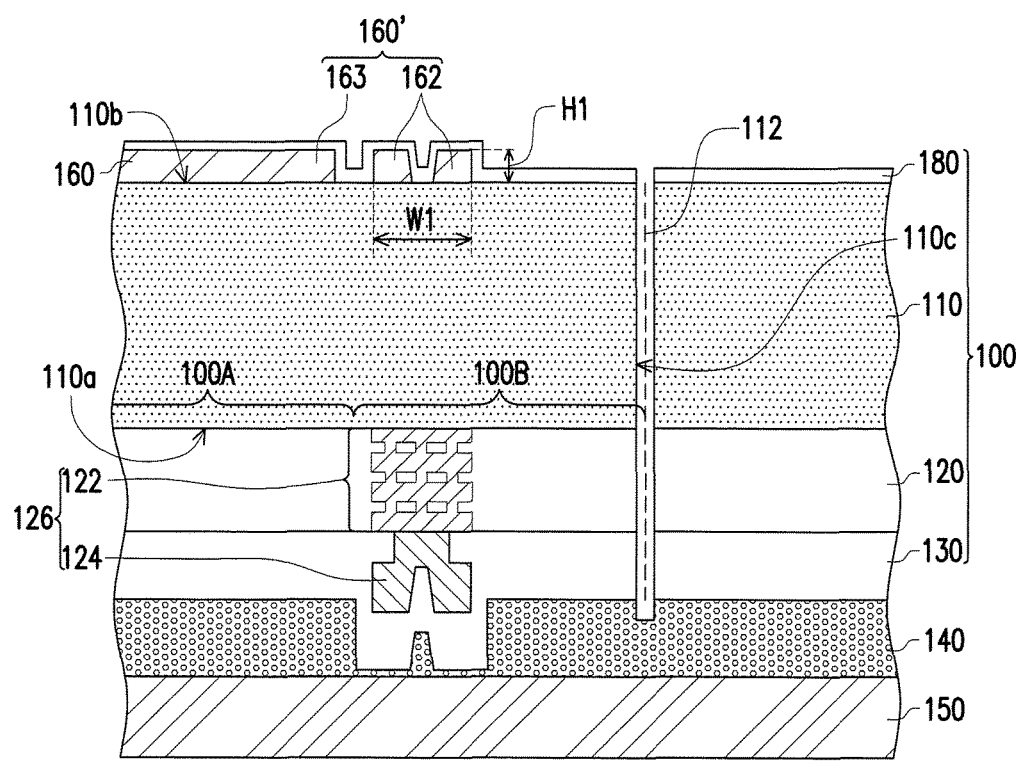

Referring to FIG. 1G, in some embodiments, a passivation layer 180 is then formed on the second surface 110b of the semiconductor device 110 and covers the backside metal routing 163 and the second seal ring 162. Similar to the dielectric layers in the interconnection layer 120 and the passivation layer 130, the passivation layer 180 may be deposited on the second surface 110b of the semiconductor device 110 and the backside metal routing 163 and the second seal ring 162 of the patterned conductive layer 160'. However, the disclosure is not limited thereto; the dielectric layers in the interconnection layer 120, the passivation layer 130, and the passivation layer 180 may be formed through any suitable process. The description of the material of the passivation layer 180 may be referred to the material of the dielectric layers in the interconnection layer 120. Furthermore, the wafer 100 has been diced along the scribe line 112 in FIG. 1G to form the semiconductor structure. It can be seen in FIG. 1G that the wafer 100 has been cut along the scribe line 112 to cingulate the semiconductor structures. After the wafer 100 has been singulated, the semiconductor structure is debonded from the carrier through any suitable pickup mechanism. Before debonding the semiconductor structure, the adhesiveness in the adhesive layer 140 may be reduced through any suitable process such as a thermal or chemical process. The semiconductor structures that are debonded may then undergo a packaging process.

As seen in FIG. 1G, the semiconductor structure of the wafer 100 is formed. The semiconductor structure includes the semiconductor device 110 having the first surface 110a and the second surface 110b opposite to the first surface 110a. The semiconductor structure includes the first seal ring 126 disposed on the first surface 110a of the semiconductor device 110 and adjacent to edges 110c of the first surface 110a. The first seal ring 126 is on the periphery region 100B of the semiconductor device 110. The semiconductor structure also includes the second seal ring 162 disposed on the second surface 110b of the semiconductor device 110 and adjacent to edges 110c of the second surface 110b. The second seal ring 162 is on the periphery region 100B of the semiconductor device 110. Thus, during a wafer dicing process, as the wafer 100 is sawed or cut at the scribe line 112, the first seal ring 126 and the second seal ring 162 can stop undesirable damaging towards the semiconductor device 110 or metallization routing on the front side and back side of the semiconductor device 110. In addition, the first seal ring 126 and the second seal ring 162 can enable structural reinforcement of the semiconductor structure, thereby preventing operational reliability of the semiconductor device 110 from being degraded. In some embodiments, the width W1 of the second seal ring 162 is between 1 um and 10 um, and the height H1 of the second seal ring 162 (or the conductive layer 160) is between 1 um and 10 um.

Figure 2A:
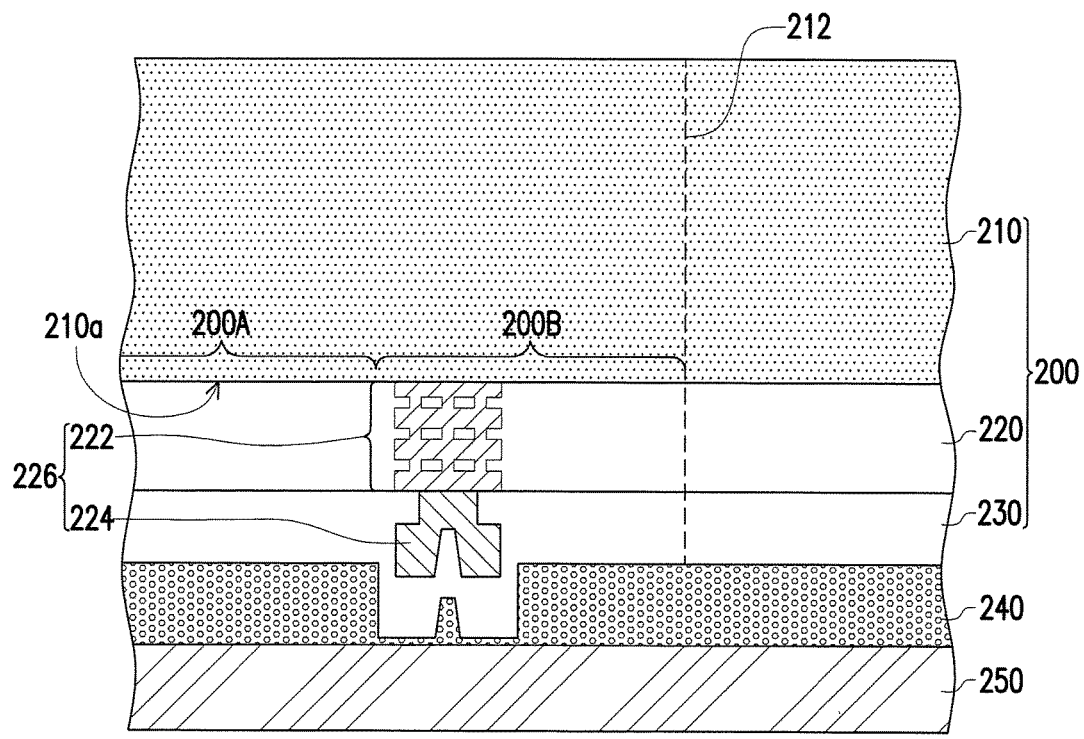
FIG. 2A to FIG. 2J are schematic cross sectionals of various stages in a semiconductor manufacturing process of a semiconductor structure according to some exemplary embodiments of the present disclosure.

FIG. 2A to FIG. 2J are schematic cross sectionals of various stages in a semiconductor manufacturing process of a semiconductor structure according to some exemplary embodiments of the present disclosure. Referring to FIG. 2A, a wafer 200 is provided. The wafer 200 is similar to the wafer 100 in FIG. 1A, and similar elements will use similar reference numerals, and similar descriptions will be repeated herein. The wafer 200 includes at least one semiconductor device 210 having a first surface 210a, an interconnection layer 220 having a first seal ring 226, scribe lines 212, and a passivation layer 230. The first seal ring 226 is made up of a seal ring structure 222 and a top metal layer 224. The wafer 200 is disposed on a carrier 250 through an adhesive layer 240. The semiconductor device 210 is similar to the semiconductor device 110, and has an active region 200A and a periphery region 200B. The same descriptions will not be repeated herein.

Figure 2B:
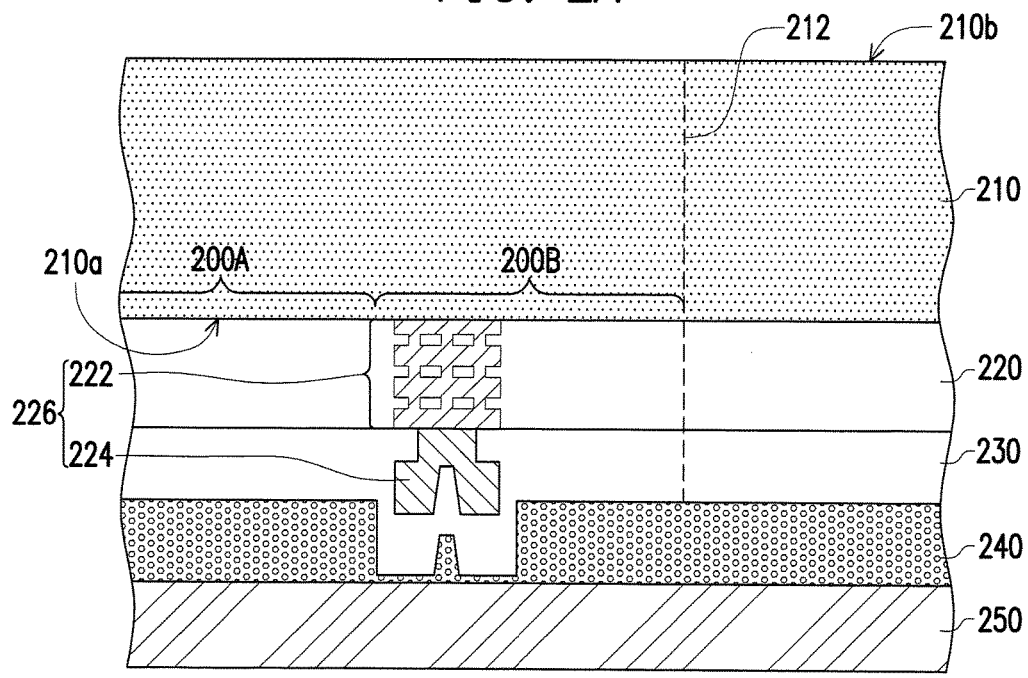
Figure 2C:
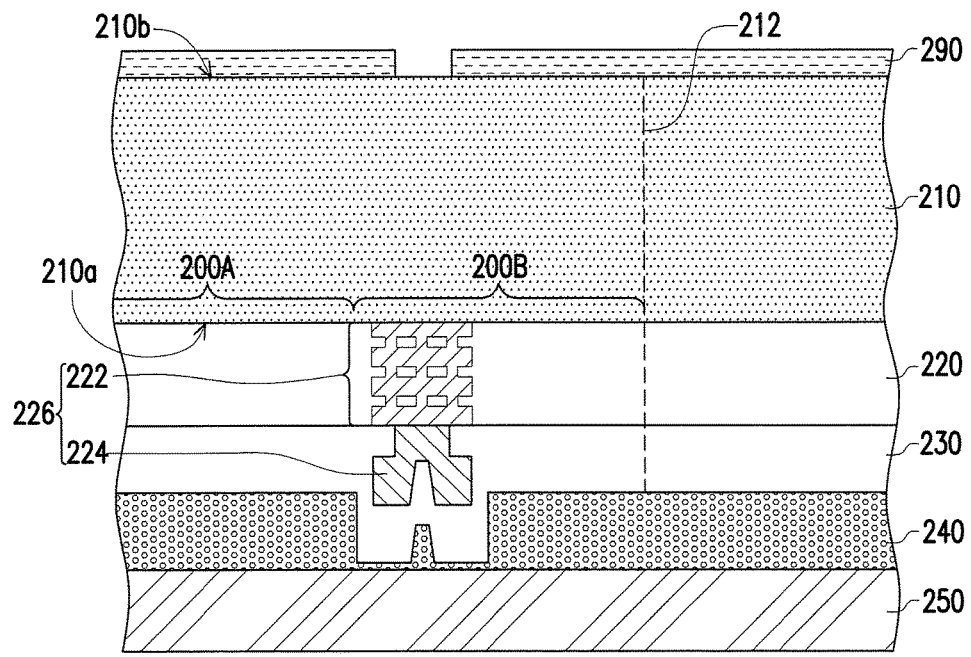

Referring to FIG. 2B, in some embodiments, the wafer 200 is thinned to a second surface 210b of the semiconductor device 210, and is similar to the description in FIG. 1B. The same description can be referred to in FIG. 1B. Next, in FIG. 2C, a patterned photoresist layer 290 is formed on the second surface 210b. In some embodiments, the patterned photoresist layer 290 is formed by forming a photoresist layer through spin coating and then patterning by projecting light through a photo mask (not shown). The material of the photoresist layer 290 is any suitable material used during the photolithography process.

Figure 2D:
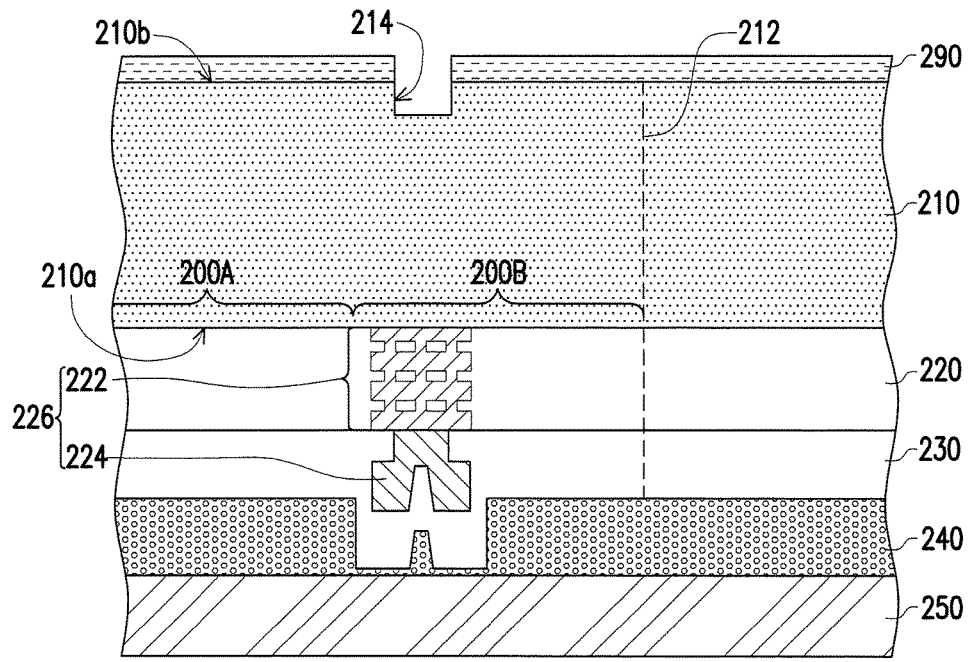
Figure 2E:
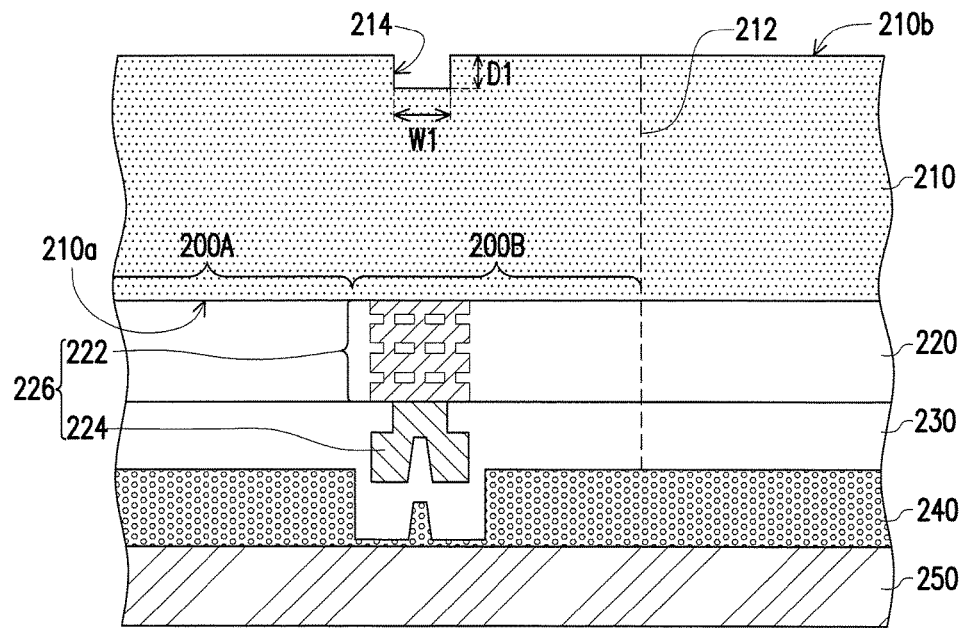

Next, in FIG. 2D, in some embodiments, a trench 214 is formed in the second surface 210b of the semiconductor device 210. The trench 214 is formed through etching by using the patterned photoresist layer 290 as a mask. The trench 214 is formed in the periphery region 200B of the semiconductor device 210. Then in FIG. 2E, in some embodiments, the patterned photoresist layer 290 is stripped and removed. The patterned photoresist layer 290 is removed through any suitable process. In some embodiments, the depth D1 (or height) of the trench 214 is between 1 um and 10 um, and the width W1 of the trench 214 is between 0.5 um and 5 um.

Figure 2F:
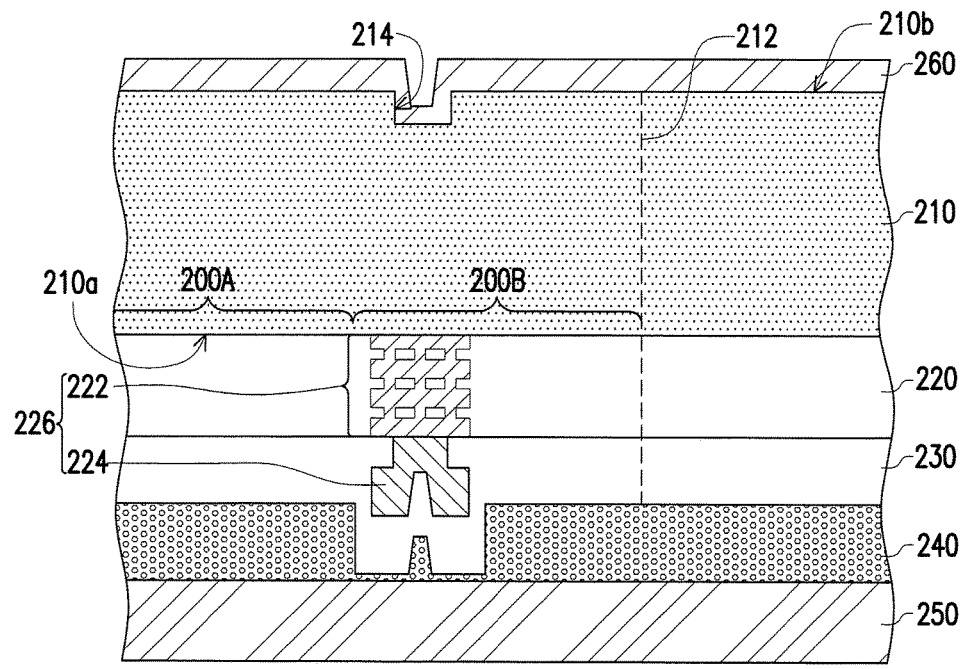

Referring to FIG. 2F, in some embodiments, a conductive layer 260 is formed conformally on the second surface 210b and the trench 214. The process of forming the conductive layer 260 may be referred to the description of forming the conductive layer 160 of FIG. 1C. The same description will not be repeated herein.

Figure 2G:
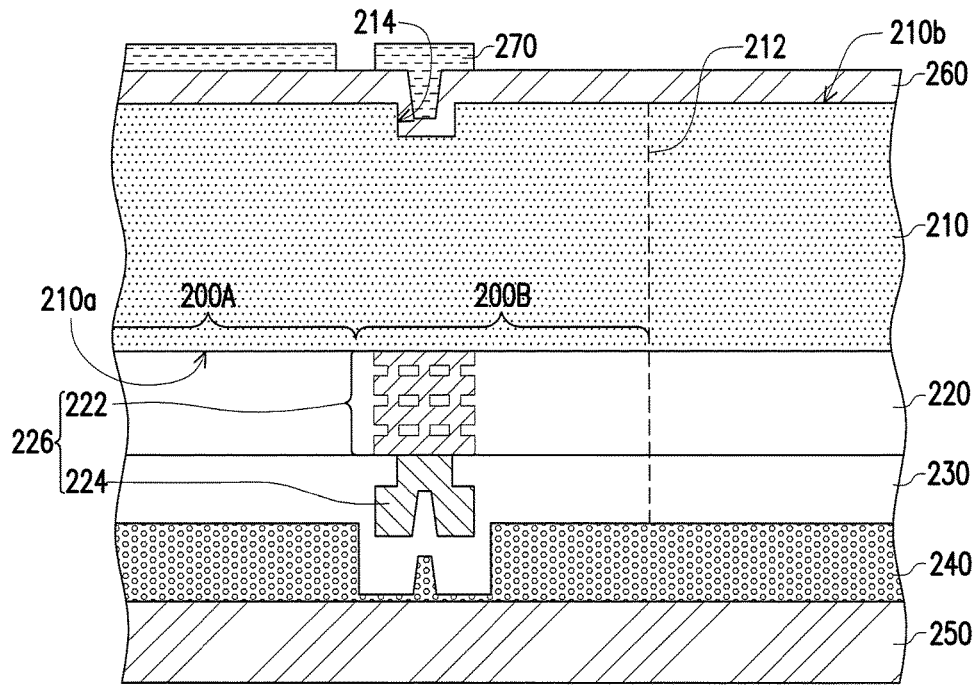

Referring to FIG. 2G, in some embodiments, a patterned photoresist layer 270 is formed on the conductive layer 260. In some embodiments, the patterned photoresist layer 270 is formed by forming a photoresist layer through spin coating and then patterning by projecting light through a photo mask (not shown). The material of the photoresist layer 270 is any suitable material used during the photolithography process.

Figure 2H:
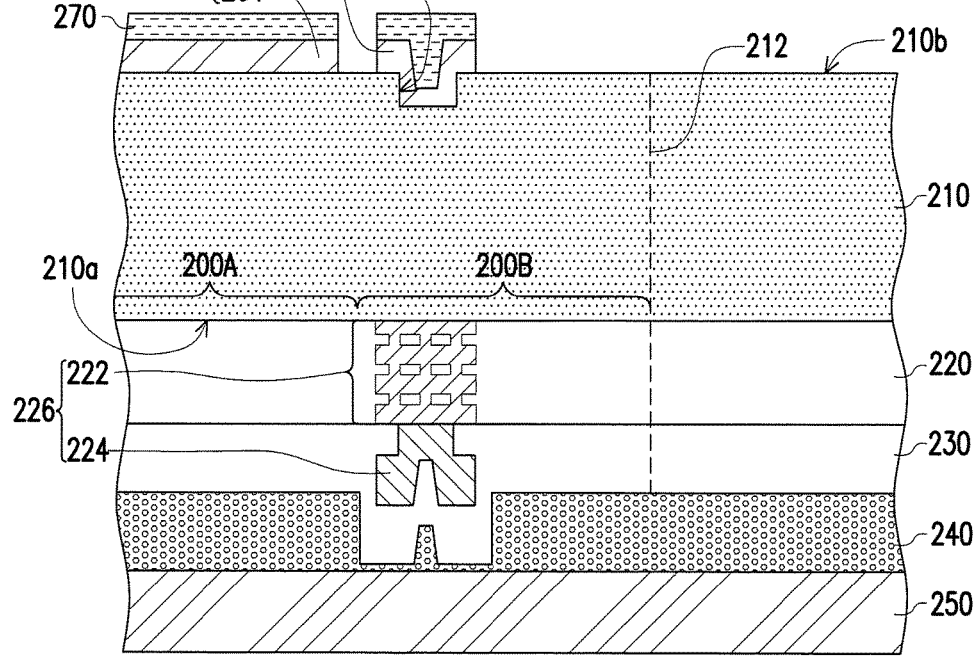
Figure 2I:
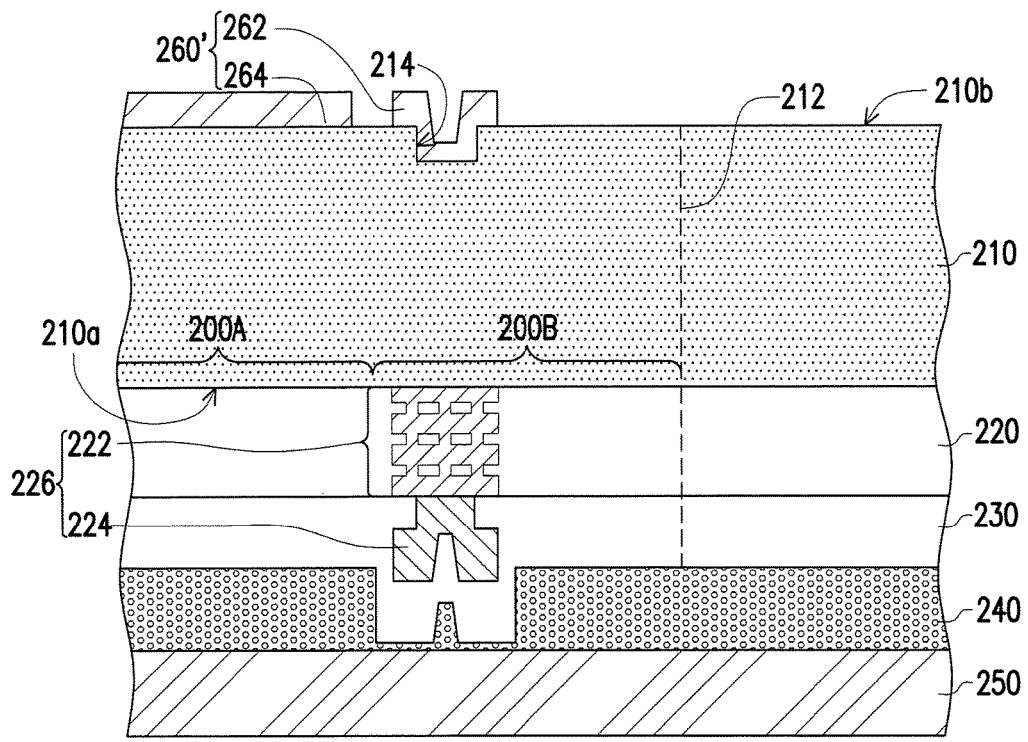

Referring to FIG. 2H, in some embodiments, the patterned photoresist layer 270 is used as the mask, and an etching process is performed towards the conductive layer 260 to pattern the conductive layer 260. The patterned conductive layer 260' has a second seal ring 262 and a backside metal routing 264. The description of forming the conductive layer 260 and the second seal ring 262 can be referred to in the description of the conductive layer 160 and the second seal ring 162 in FIG. 1E. The difference is, in FIG. 2H, the second seal ring 262 is formed on the trench 214, such that the shape of the trench 214 from a top view is conformal to the shape of the second seal ring 262 from a top view. The second seal ring 262 overlaps the trench 214, and is on the periphery region 200B of the semiconductor device 210. In some embodiments, the second seal ring 262 is electrically floated, or electrically grounded. Then in FIG. 2I, in some embodiments, the patterned photoresist layer 270 is stripped and removed. The patterned photoresist layer 270 is removed through any suitable process.

Figure 2J:
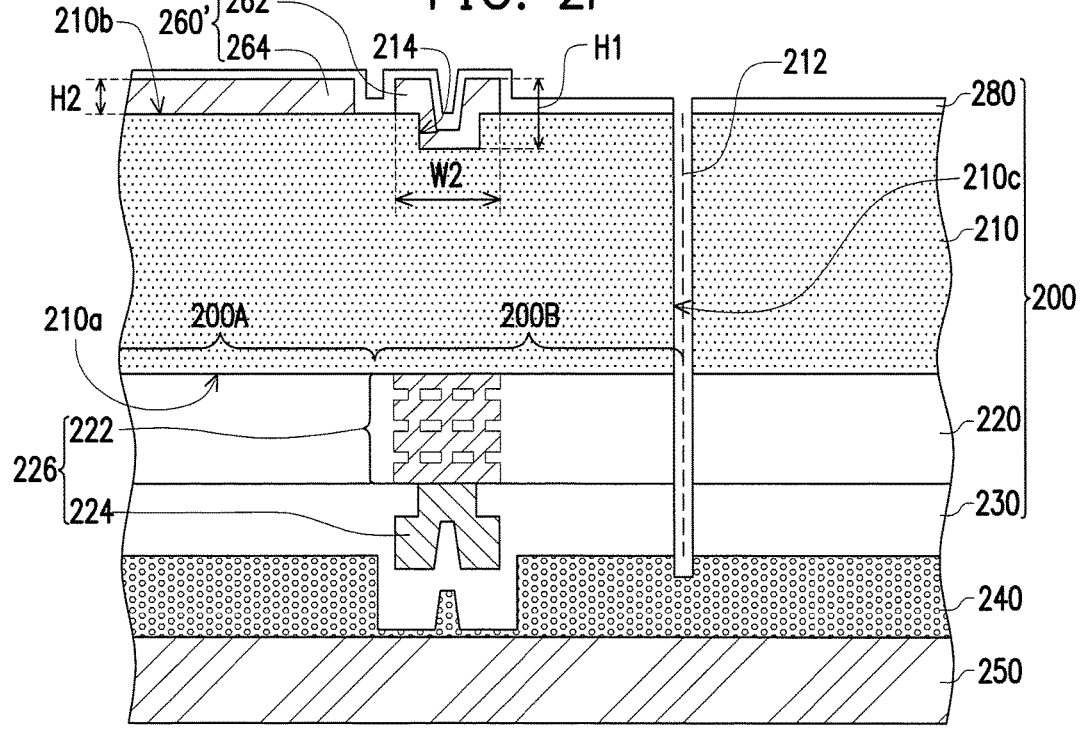

Referring to FIG. 2J, in some embodiments, a passivation layer 280 is then formed on the second surface 210b of the semiconductor device 210 and covers the patterned conductive layer 260'. The description of forming the passivation layer 280 can be referred to the description of forming the passivation layer 180 in FIG. 1G. The same description will not be repeated herein. Furthermore, the wafer 200 has been diced along the scribe line 212 in FIG. 2J to form the semiconductor structure. The dicing and debonding process can be referred to the description in FIG. 1G, and the same description will not be repeated herein.

As seen in FIG. 2J, the semiconductor structure of the wafer 200 is formed. The semiconductor structure of the wafer 200 is similar to the semiconductor structure of the wafer 100 of FIG. 1G. The difference is, in FIG. 2J, the semiconductor structure of the wafer 200 further includes the trench 214. By having the trench 214, the structure of the second seal ring 262 is further reinforced and enhanced. In some embodiments, the height H1 of the second seal ring 262 is between 2 um and 20 um, and the width W2 of the second seal ring 262 is between 1 um and 10 um. In some embodiments, the height H2 of the conductive layer 260 is between 1 um and 10 um. Furthermore, it can be seen that the semiconductor structure includes the first seal ring 226 disposed on the first surface 210a of the semiconductor device 210 and adjacent to edges 210c of the first surface 210a. The semiconductor structure also includes the second seal ring 262 disposed on the second surface 210b of the semiconductor device 210 and adjacent to edges 210c of the second surface 210b.

Figure 3A:
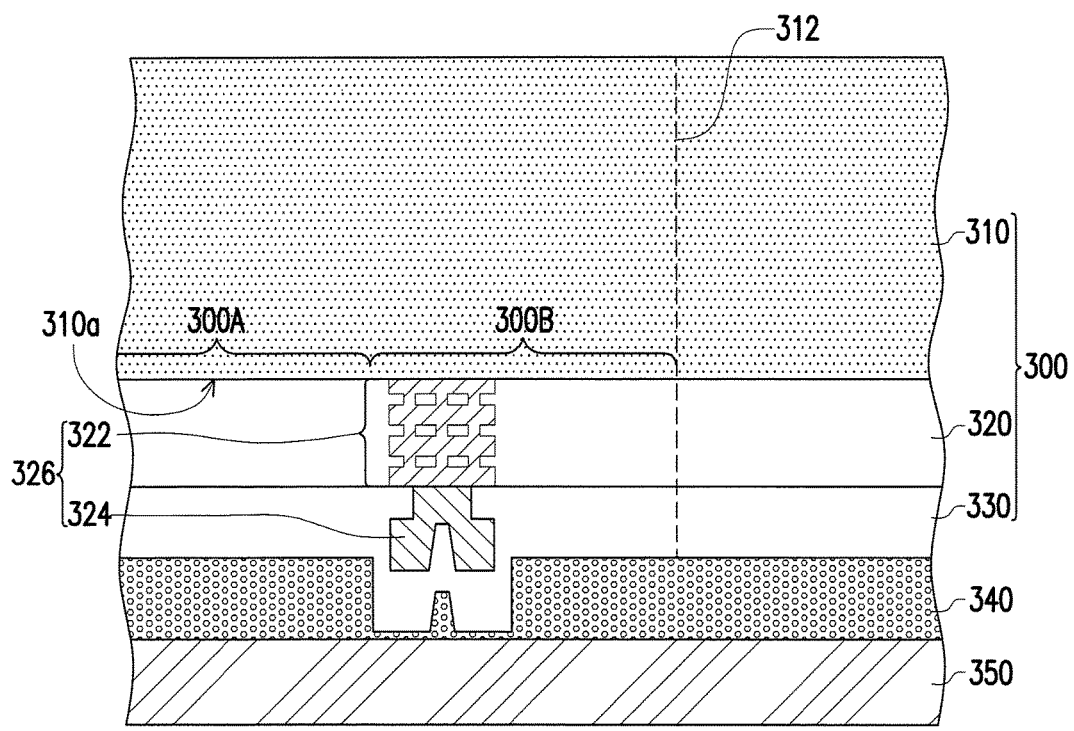
FIG. 3A to FIG. 3I are schematic cross sectionals of various stages in a semiconductor manufacturing process of a semiconductor structure according to some exemplary embodiments of the present disclosure.

FIG. 3A to FIG. 3I are schematic cross sectionals of various stages in a semiconductor manufacturing process of a semiconductor structure according to some exemplary embodiments of the present disclosure. Referring to FIG. 3A, a wafer 300 is provided. The wafer 300 is similar to the wafer 100 in FIG. 1A, and similar elements will use similar reference numerals, and similar descriptions will be repeated herein. The wafer 300 includes at least one semiconductor device 310 having a first surface 310a, an interconnection layer 320 having a first seal ring 326, scribe lines 312, and a passivation layer 330. The first seal ring 326 is made up of a seal ring structure 322 and a top metal layer 324. The wafer 300 is disposed on a carrier 350 through an adhesive layer 340. The semiconductor device 310 is similar to the semiconductor device 110, and has an active region 300A and a periphery region 300B. The same descriptions will not be repeated herein.

Figure 3B:
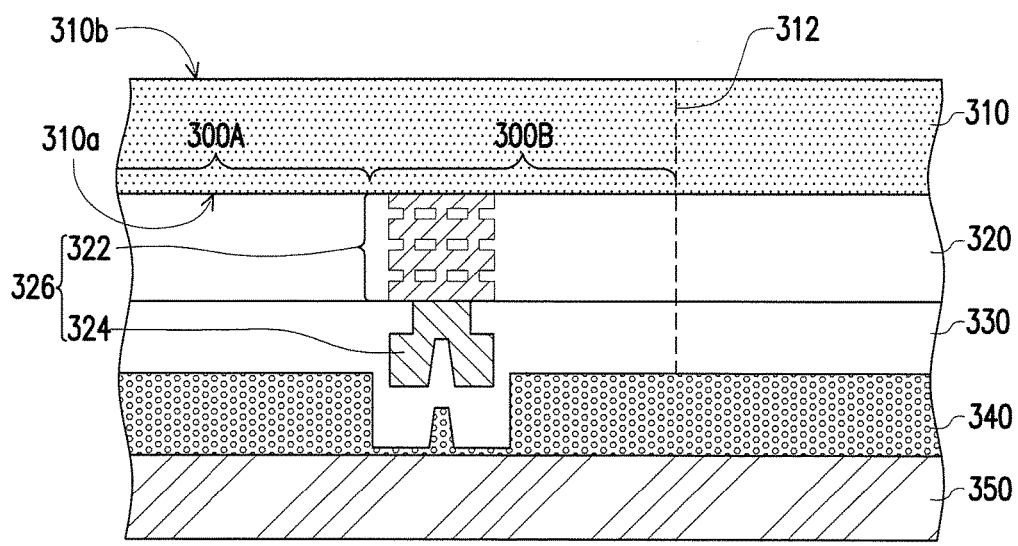

Referring to FIG. 3B, in some embodiments, the wafer 300 is thinned to a second surface 310b of the semiconductor device 310, and is similar to the description in FIG. 1B. The same description can be referred to in FIG. 1B.

Figure 3C:
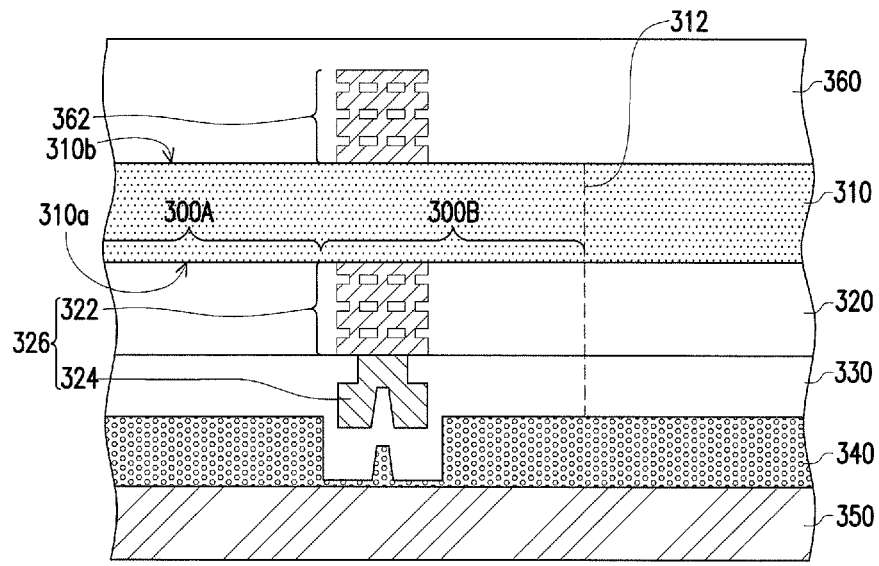

Next, in FIG. 3C, an interconnection layer 360 is formed. The interconnection layer 360 is formed by dielectric material layers and metallization layers layer by layer. In some embodiments, the interconnection layer 360 may include more or less than the number of dielectric material layers shown in FIG. 3C. In alternative embodiments, the interconnection layer 360 may include more or less than the number of metallization layers shown. The number of metallization layers and the number of dielectric material layers may be adjusted depending on the routing requirement of the respective semiconductor structure. The material of the metallization layers and the dielectric material layers may be referred to the description of the interconnection layer 120 in FIG. 1A. The same description will not be repeated herein.

Further referring to FIG. 3C, in some embodiments, as the interconnection layer 360 is formed, a first seal ring structure 362 is also formed by dielectric material layers and metallization layers layer by layer as described above. Other portions of the interconnection layer 360 may include other interconnect structures not shown for other routing requirements of the devices in the active region 300A of the semiconductor device 310. The first seal ring structure 362 is formed on the periphery region 300B of the semiconductor device 310. The periphery region 300B of the semiconductor device 310 does not include the devices. The periphery region 300B surrounds the active region 300A. The first seal ring structure 362 may be formed with the other interconnect structures in the interconnection layer 360, or be formed independently of the other interconnect structures in the interconnection layer 360.

Figure 3D:
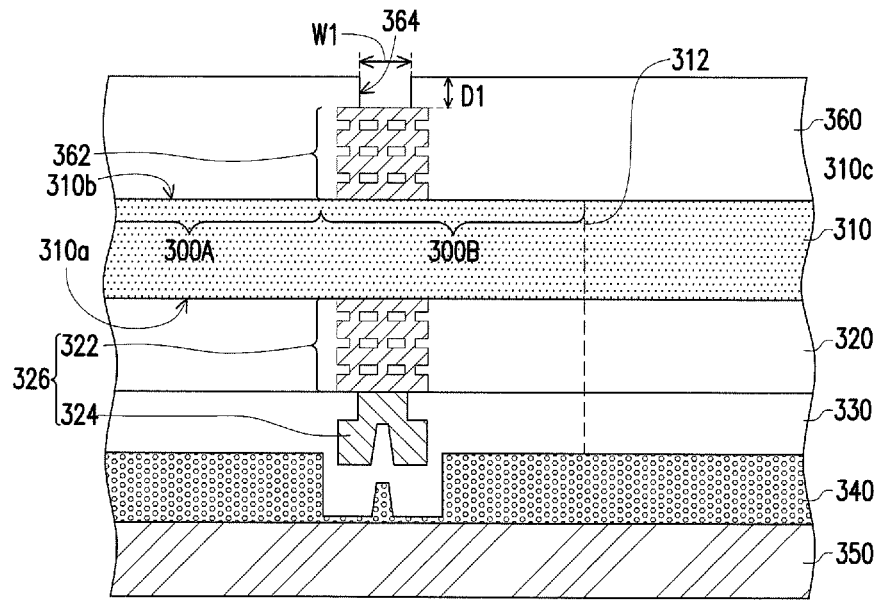

Referring to FIG. 3D, in some embodiments, a trench 364 is formed in the interconnection layer 360. The process of forming the trench 364 is similar to the process of forming the trench 214 in FIGS. 2C, 2D, and 2E. The same descriptions will not be repeated herein. In some embodiments, the depth D1 (or height) of the trench 364 is between 1 um and 10 um, and the width W1 of the trench 364 is between 0.5 um and 5 um.

Figure 3E:
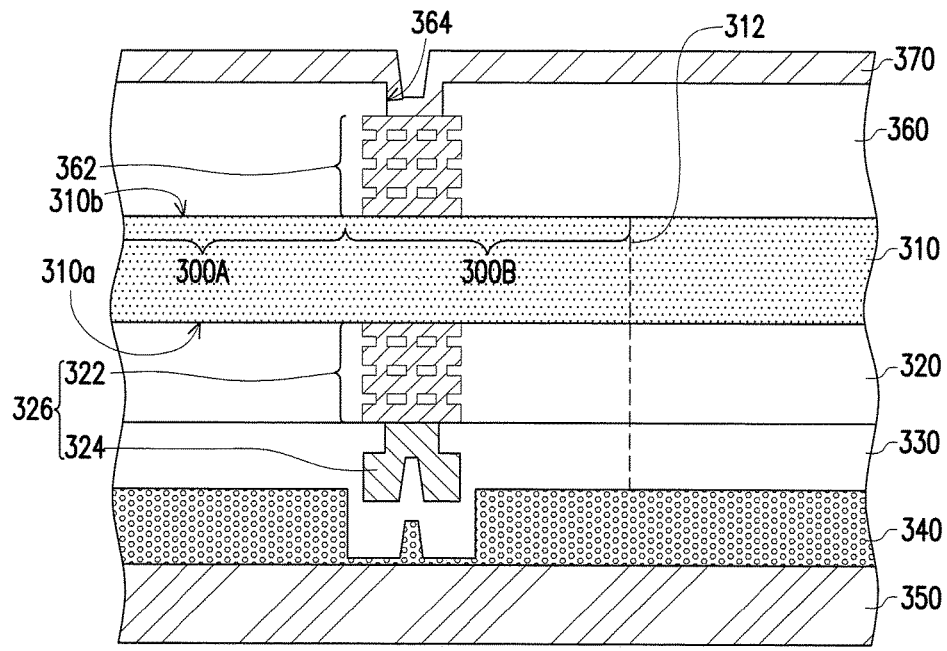

Referring to FIG. 3E, a conductive layer 370 is formed with the interconnection layer 360, and is formed conformally on the interconnection layer 360, the trench 364, and the first seal ring structure 362. The process of forming the conductive layer 370 may be referred to the description of forming the conductive layer 160 of FIG. 1C. The same description will not be repeated herein.

Figure 3F:
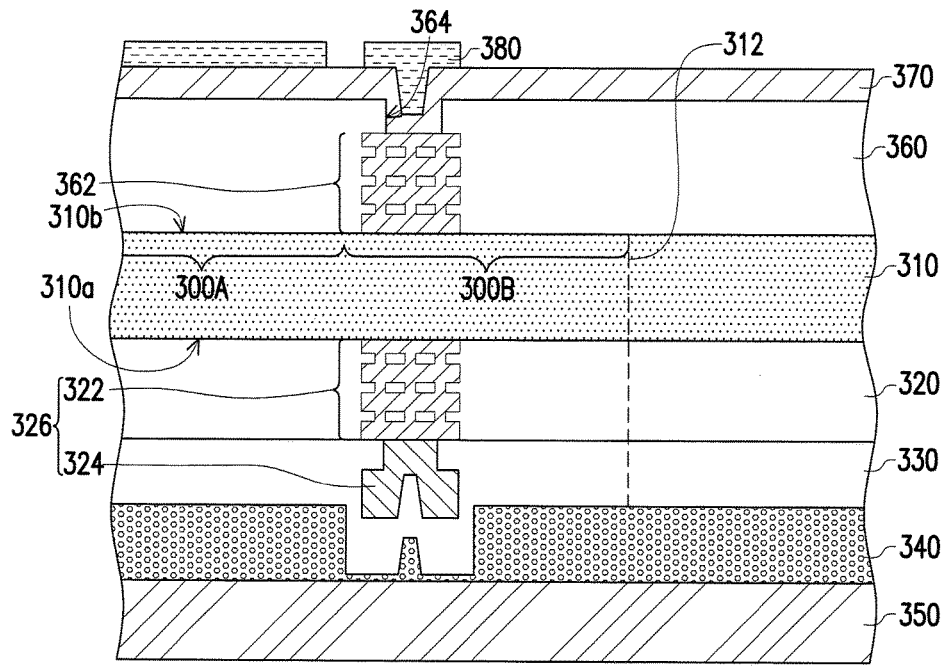

Referring to FIG. 3F, in some embodiments, a patterned photoresist layer 380 is formed on the conductive layer 370. In some embodiments, the patterned photoresist layer 380 is formed by forming a photoresist layer through spin coating and then patterning by projecting light through a photo mask (not shown). The material of the photoresist layer 380 is any suitable material used during the photolithography process.

Figure 3G:
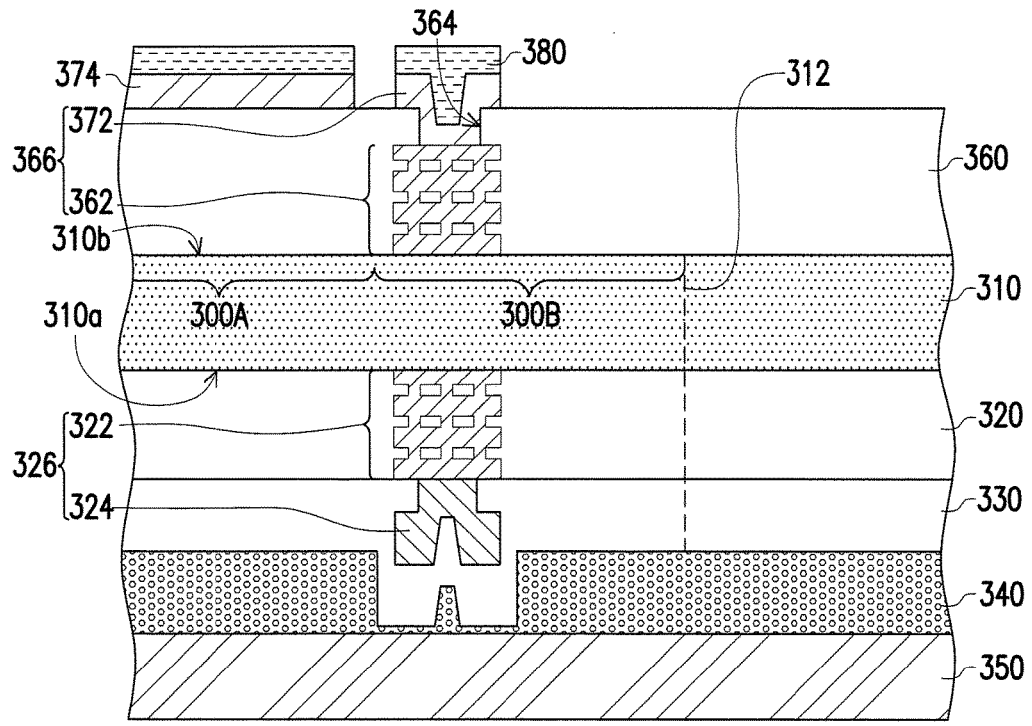
Figure 3H:
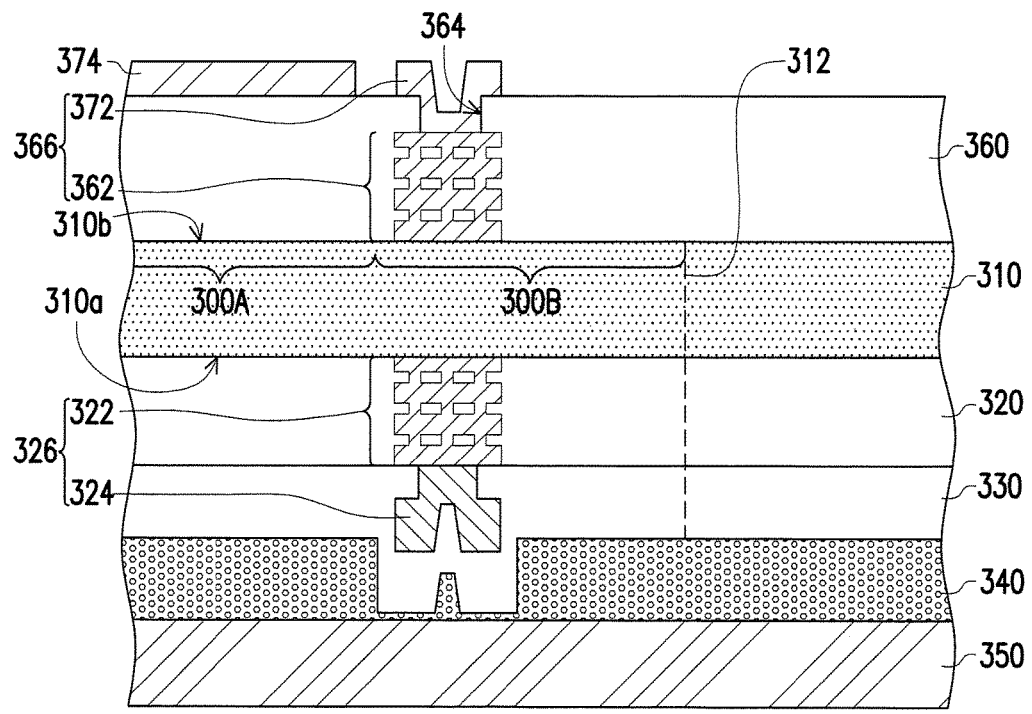

Referring to FIG. 3G, in some embodiments, the patterned photoresist layer 380 is used as the mask, and an etching process is performed towards the conductive layer 370 to pattern the conductive layer 370. The patterning of the conductive layer 370 forms a second seal ring structure 372 and a backside metal routing 374. The description of forming the conductive layer 370 and the second seal ring structure 372 can be referred to in the description of the conductive layer 160 and the second seal ring 162 in FIG. 1E. The difference is, in FIG. 3G, the second seal ring structure 372 is formed on the trench 364, such that the shape of the trench 364 from a top view is conformal to the shape of the second seal ring structure 372 from a top view. The second seal ring structure 372 overlaps the trench 364 and is connected to the first seal ring structure 362 to form the second seal ring 366 of the interconnection layer 360. The second seal ring 366 is on the periphery region 300B of the semiconductor device 310. In some embodiments, the second seal ring 366 is electrically floated, or electrically grounded. Then in FIG. 3H, in some embodiments, the patterned photoresist layer 380 is stripped and removed. The patterned photoresist layer 380 is removed through any suitable process.

Figure 3I:
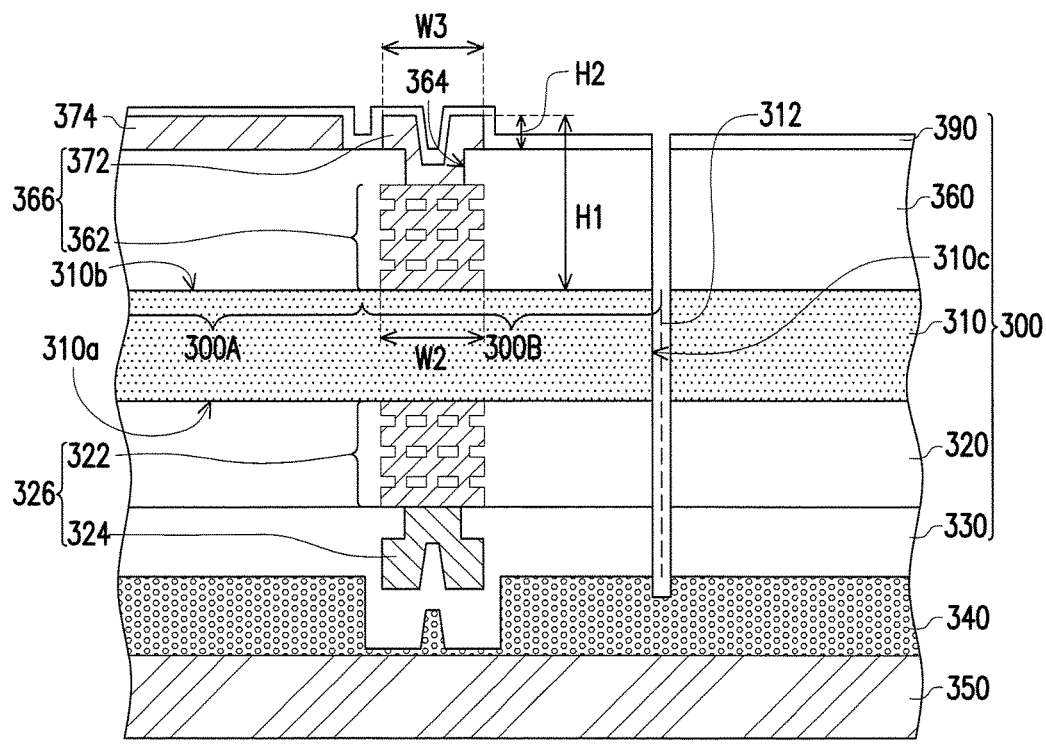

Referring to FIG. 3I, in some embodiments, a passivation layer 390 is then formed on the interconnection layer 360 and covers the patterned conductive layer 370 and the second seal ring 366. The description of forming the passivation layer 390 can be referred to the description of forming the passivation layer 180 in FIG. 1G. The same description will not be repeated herein. Furthermore, the wafer 300 has been diced along the scribe line 312 in FIG. 3I to form the semiconductor structure. The dicing and debonding process can be referred to the description in FIG. 1G, and the same description will not be repeated herein.

As seen in FIG. 3I, the semiconductor structure of the wafer 300 is formed. The semiconductor structure of the wafer 300 is similar to the semiconductor structure of the wafer 100 of FIG. 1G. The difference is, in FIG. 3I, the semiconductor structure of the wafer 300 further includes the interconnection layer 360 having the trench 364, and the first seal ring structure 362 and the second seal ring structure 372. By having the interconnection layer 360, the semiconductor structure of the wafer 300 may have additional interconnections and routing on the backside of the semiconductor device 310. Furthermore, having the first seal ring structure 362 and the second seal ring structure 372 of the second seal ring 366 is further reinforces and enhances the protection of the metal routing on the back side of the semiconductor device 310. In some embodiments, the height H1 of the second seal ring 366 is between 5 um and 60 um, and the width W2 of the first seal ring structure 362 of the second seal ring 366 is between 1 um and 10 um. In some embodiments, the width W3 of the second seal ring structure 372 of the second seal ring 366 is between 1 um and 10 um. In some embodiments, the height H2 of the conductive layer 370 is between 1 um and 10 um. Furthermore, it can be seen that the semiconductor structure includes the first seal ring 326 disposed on the first surface 310a of the semiconductor device 310 and adjacent to edges 310c of the first surface 310a. The semiconductor structure also includes the second seal ring 362 disposed on the second surface 310b of the semiconductor device 310 and adjacent to edges 310c of the second surface 310b.

Figure 4:
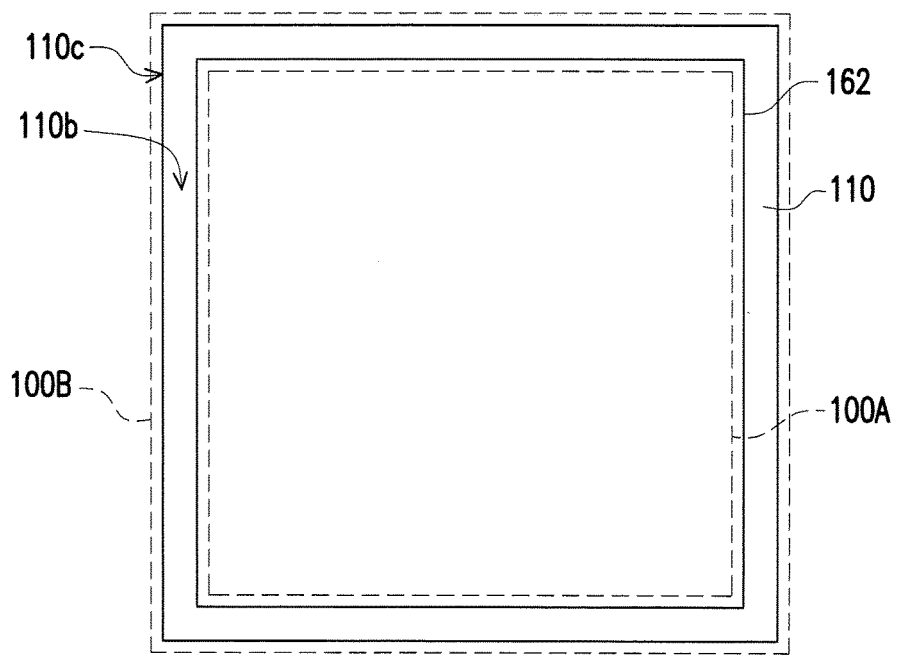
FIG. 4 is a schematic backside view illustrating a semiconductor structure according to some exemplary embodiments of the present disclosure.

FIG. 4 is a schematic backside view illustrating a semiconductor structure according to some exemplary embodiments of the present disclosure. Referring to FIG. 4, FIG. 4 shows the backside of the semiconductor structure of the wafer 100. Specifically, the second seal ring 162 on the second surface 110b of the semiconductor device 110 is shown, and adjacent to the edges 110c of the second surface 110b. The passivation layer 180 on the second surface 110b and covering the second seal ring 162 is not shown. In addition, the backside metal routing of the patterned conductive layer 160 is not shown. It can be seen that the second seal ring 162 is a single seal ring loop pattern. From a plan view of the backside of the semiconductor structure, the shape of the second seal ring 162 is a square. However, the disclosure is not limited thereto. In other embodiments, the second seal ring 162 in FIG. 4 is a circle, polygon, or any other suitable shape from a plan view. In addition, in other embodiments, the second seal ring 162 is not a closed loop, but may have openings in the second seal ring 162 loop pattern. Furthermore, the second seal ring 162 surrounds the active region 100A. The second seal ring 162 is on the periphery region 100B of the semiconductor device 110, and the periphery region 100B extends to the area of the semiconductor device 110 outside of the second seal ring 162. That is to say, the active region 100A is the region within the dotted line labeled as 100A. The periphery region 100B is the region between the dotted lined area labeled 100B to the dotted lined area labeled 100A. In some embodiments, the dotted line labeled as 100B overlaps with the outermost edges of the semiconductor device 110.

Figure 5:
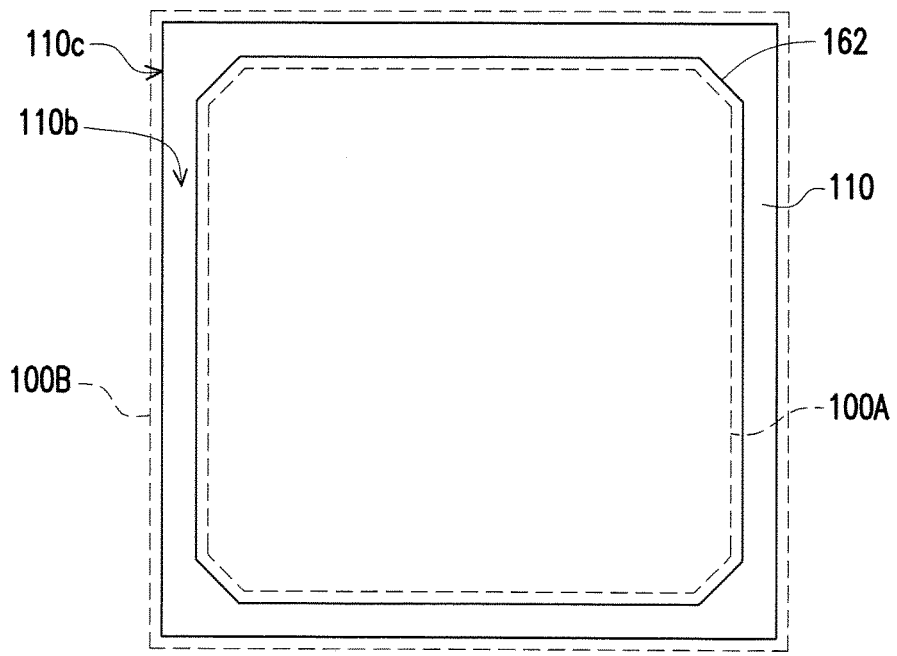
FIG. 5 is a schematic backside view illustrating a semiconductor structure according to some other exemplary embodiments of the present disclosure.

FIG. 5 is a schematic backside view illustrating a semiconductor structure according to some other exemplary embodiments of the present disclosure. Referring to FIG. 5, FIG. 5 shows the backside of the semiconductor structure of the wafer 100 according to another embodiment of the disclosure. The description of the second seal ring 162 in FIG. 5 is similar to the description of the second seal ring 162 in FIG. 4. The same descriptions will not be repeated herein. The difference is, in the second seal ring 162 of FIG. 5, from a plan view of the backside of the semiconductor structure, the shape of the second seal ring 162 is an octagon. However, the disclosure is not limited thereto. In other embodiments, the second seal ring 162 of FIG. 5 is a circle, polygon, or any other suitable shape from a plan view.

Figure 6:
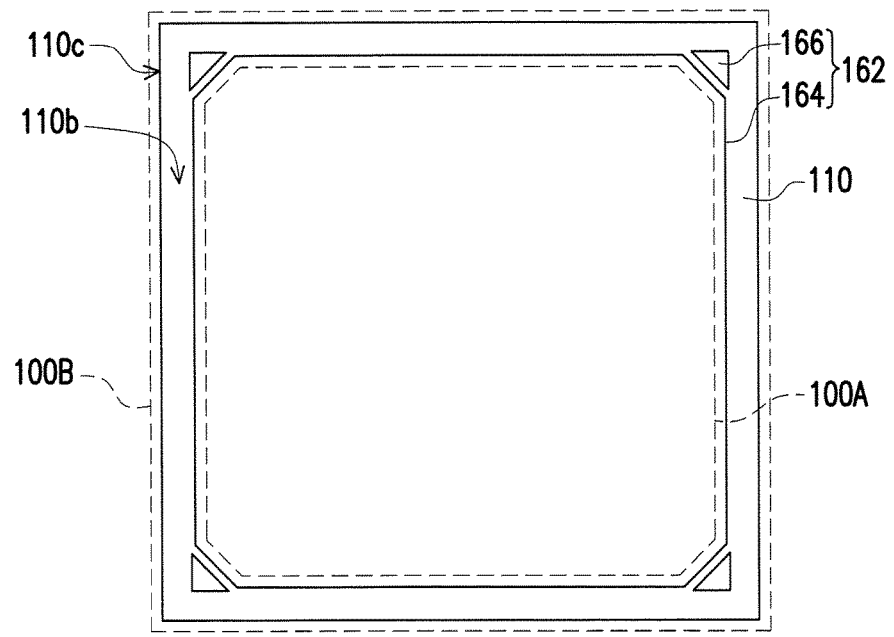
FIG. 6 is a schematic backside view illustrating a semiconductor structure according to some other exemplary embodiments of the present disclosure.

FIG. 6 is a schematic backside view illustrating a semiconductor structure according to some other exemplary embodiments of the present disclosure. Referring to FIG. 6, FIG. 6 shows the backside of the semiconductor structure of the wafer 100 according to another embodiment of the disclosure. The description of the second seal ring 162 in FIG. 6 is similar to the description of the second seal ring 162 in FIG. 4. The same descriptions will not be repeated herein. The difference is the second seal ring 162 of FIG. 6 includes a second seal ring loop 164 and a plurality of corner structures 166. The corner structures 166 are formed as a same layer as the second seal ring loop 164, are disposed between the corners of the semiconductor device 110 and the second seal ring loop 164 of the second seal ring 162. In some embodiments, from a plan view of the backside of the semiconductor structure 110, the description of the shape of the second seal ring 162 can be referred to in FIG. 5, and will not be repeated herein. In some embodiments, from a plan view of the backside of the semiconductor structure 110, the shape of the corner structures 166 is a triangle, and the number of corner structures 166 is four. However, the disclosure is not limited thereto. In other embodiments, the shape of the corner structures 166 is a circle, polygon, or any other suitable shape from a plan view, and the number of corner structures 166 can be adjusted according to user requirements. The corner structures 166 further reinforce and enhance the strength of the second seal ring 162 around the edges of the second seal ring loop 164.

Figure 7:
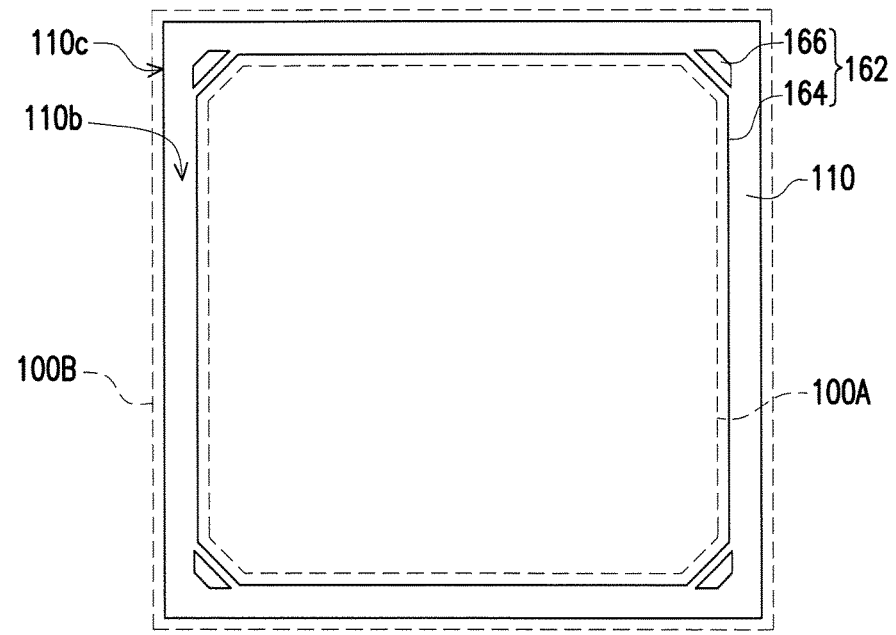
FIG. 7 is a schematic backside view illustrating a semiconductor structure according to some other exemplary embodiments of the present disclosure.

FIG. 7 is a schematic backside view illustrating a semiconductor structure according to some other exemplary embodiments of the present disclosure. Referring to FIG. 7, FIG. 7 shows the backside of the semiconductor structure of the wafer 100 according to another embodiment of the disclosure. The description of the second seal ring 162 in FIG. 7 is similar to the description of the second seal ring 162 in FIG. 6. The same descriptions will not be repeated herein. The difference is the shape of the corner structures 166 in FIG. 7 from a plan view is a pentagon. However, the disclosure is not limited thereto. In other embodiments, the shape of the corner structures 166 is a circle, polygon, or any other suitable shape from a plan view.

Figure 8:
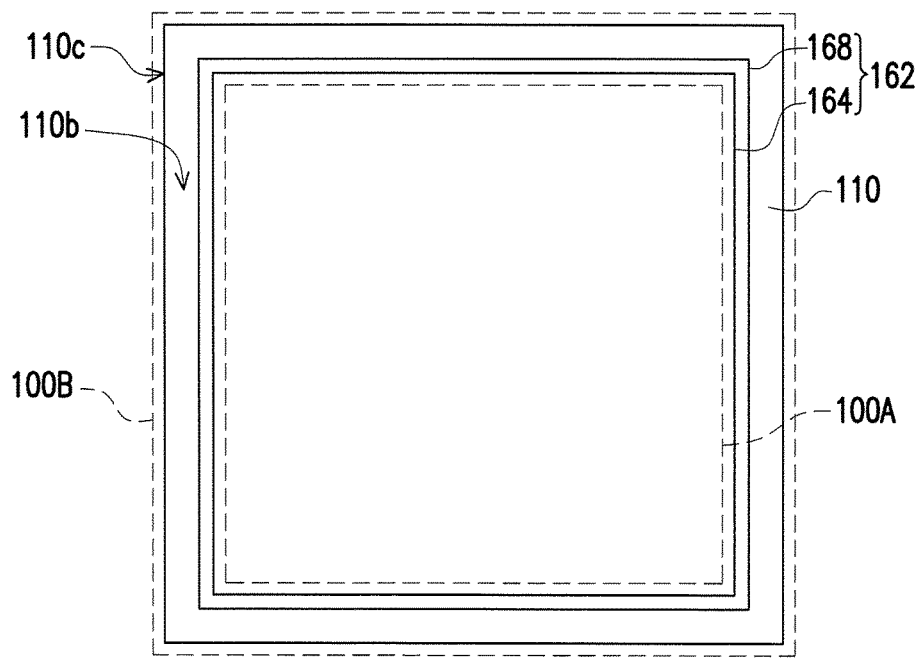
FIG. 8 is a schematic backside view illustrating a semiconductor structure according to some other exemplary embodiments of the present disclosure.

FIG. 8 is a schematic backside view illustrating a semiconductor structure according to some other exemplary embodiments of the present disclosure. Referring to FIG. 8, FIG. 8 shows the backside of the semiconductor structure of the wafer 100 according to another embodiment of the disclosure. The description of the second seal ring 162 in FIG. 8 is similar to the description of the second seal ring 162 in FIG. 4. The same descriptions will not be repeated herein. The difference is that the second seal ring 162 of FIG. 8 is a multiple seal ring loop structure. That is to say, the second seal ring 162 of FIG. 8 has a first seal ring loop 164 and a second seal ring loop 168. The second seal ring loop 168 surrounds the first seal ring loop 164. The second seal ring loop 168 and the first seal ring loop 164 are formed as the same layer to form the second seal ring 162. From a plan view of the backside of the semiconductor structure, the shapes of the second seal ring loop 168 and the first seal ring loop 164 are squares. However, the disclosure is not limited thereto. In other embodiments, the shapes of the second seal ring loop 168 and the first seal ring loop 164 may be circles, polygons, or any other suitable shapes from a plan view. In addition, the shapes of the second seal ring loop 168 and the first seal ring loop 164 may be different from each other. In addition, in other embodiments, the second seal ring loop 168 and the first seal ring loop 164 are not closed loops, but may have openings in the second seal ring 162 loop pattern. By being a multiple seal ring loop structure, the second seal ring 162 is further reinforced and enhanced.

Figure 9:
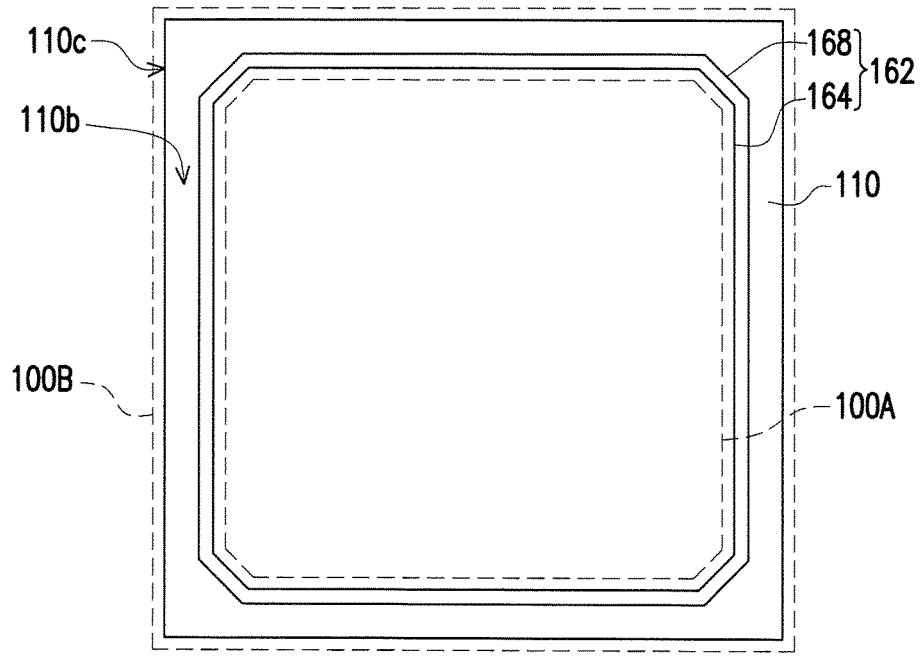
FIG. 9 is a schematic backside view illustrating a semiconductor structure according to some other exemplary embodiments of the present disclosure.

FIG. 9 is a schematic backside view illustrating a semiconductor structure according to some other exemplary embodiments of the present disclosure. Referring to FIG. 9, FIG. 9 shows the backside of the semiconductor structure of the wafer 100 according to another embodiment of the disclosure. The description of the second seal ring 162 in FIG. 9 is similar to the description of the second seal ring 162 in FIG. 8. The same descriptions will not be repeated herein. The difference is, in the second seal ring 162 of FIG. 5, from a plan view of the backside of the semiconductor structure, the shapes of the second seal ring loop 168 and the first seal ring loop 164 are octagons. However, the disclosure is not limited thereto. In other embodiments, the shapes of the second seal ring loop 168 and the first seal ring loop 164 may be circles, polygons, or any other suitable shapes from a plan view. In addition, the shapes of the second seal ring loop 168 and the first seal ring loop 164 may be different from each other.

Figure 10:
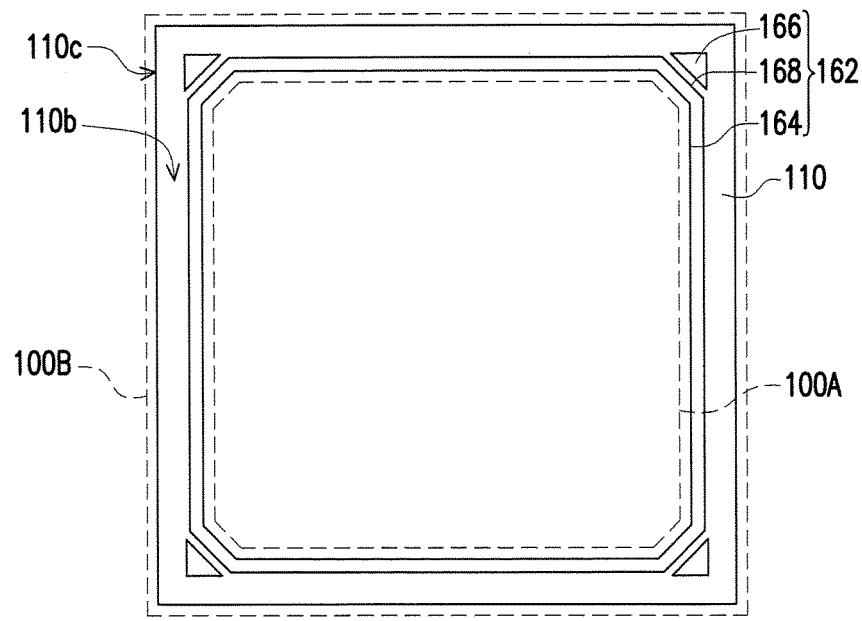
FIG. 10 is a schematic backside view illustrating a semiconductor structure according to some other exemplary embodiments of the present disclosure.

FIG. 10 is a schematic backside view illustrating a semiconductor structure according to some other exemplary embodiments of the present disclosure. Referring to FIG. 10, FIG. 10 shows the backside of the semiconductor structure of the wafer 100 according to another embodiment of the disclosure. The description of the second seal ring 162 in FIG. 10 is similar to the description of the second seal ring 162 in FIG. 8. The same descriptions will not be repeated herein. The difference is, in the second seal ring 162 of FIG. 10, further includes a plurality of corner structures 166. The corner structures 166 are formed as a same layer as the first and second seal ring loops 164, 168, and are disposed between the corners of the semiconductor device 110 and the second seal ring loop 168 of the second seal ring 162. In some embodiments, from a plan view of the backside of the semiconductor structure 110, the description of the shapes of the second seal ring loop 168 and the first seal ring loop can be referred to in FIG. 9, and will not be repeated herein. In some embodiments, from a plan view of the backside of the semiconductor structure 110, the shape of the corner structures 166 is a triangle, and the number of corner structures 166 is four. However, the disclosure is not limited thereto. In other embodiments, the shape of the corner structures 166 is a circle, polygon, or any other suitable shape from a plan view, and the number of corner structures 166 can be adjusted according to user requirements. The corner structures 166 further reinforce and enhance the strength of the second seal ring 162 around the edges of the second seal ring loop 168 and the first seal ring loop 164.

Figure 11:
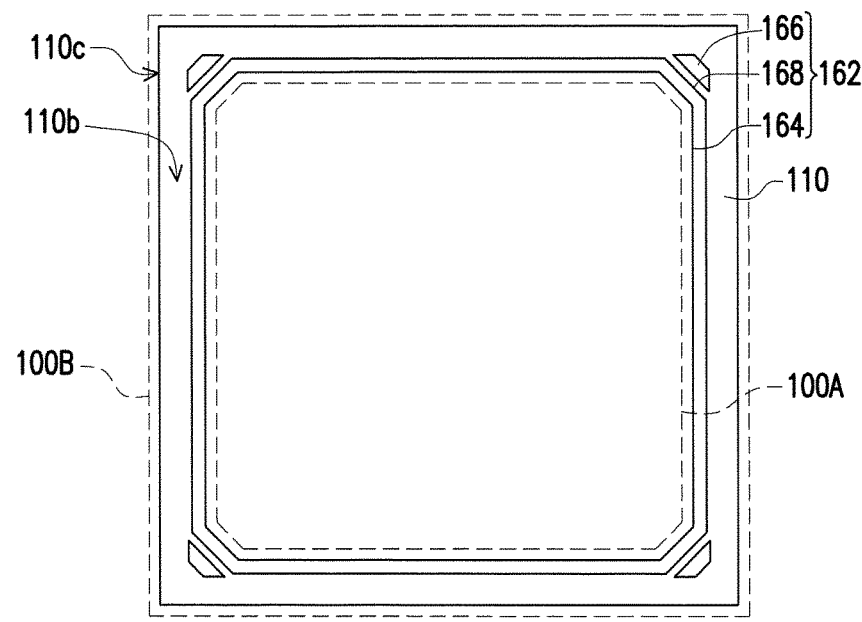
FIG. 11 is a schematic backside view illustrating a semiconductor structure according to some other exemplary embodiments of the present disclosure.

FIG. 11 is a schematic backside view illustrating a semiconductor structure according to some other exemplary embodiments of the present disclosure. Referring to FIG. 11, FIG. 11 shows the backside of the semiconductor structure of the wafer 100 according to another embodiment of the disclosure. The description of the second seal ring 162 in FIG. 11 is similar to the description of the second seal ring 162 in FIG. 10. The same descriptions will not be repeated herein. The difference is the shape of the corner structures 166 in FIG. 11 from a plan view is a pentagon. However, the disclosure is not limited thereto. In other embodiments, the shape of the corner structures 166 is a circle, polygon, or any other suitable shape from a plan view.

It should be noted that the second seal ring patterns shown in FIG. 4 to FIG. 11 can also be applied to the wafers 200, 300 in the embodiments of FIG. 2J and FIG. 3I. That is to say, the second seal rings 262 and 366 can also apply the different seal ring patterns shown in FIG. 4 to FIG. 11. That is to say, the multiple seal ring loop patterns and corner structures may also have the trench structures 214, 364 and/or the seal ring structure 362 shown in FIG. 3I. The disclosure is not limited thereto. Furthermore, from a top side view, the first seal rings 126, 226, 326 in the embodiments of FIG. 1A, FIG. 2A, and FIG. 3A can also apply the different seal ring patterns shown in FIG. 4 to FIG. 11. The disclosure is not limited thereto.

According to some embodiments, a semiconductor structure has a semiconductor device, a first seal ring, and a second seal ring. The semiconductor device has a first surface and a second surface opposite to the first surface. The first seal ring is disposed on the first surface of the semiconductor device and adjacent to edges of the first surface. The second seal ring is disposed on the second surface of the semiconductor device and adjacent to edges of the second surface.

According to some embodiments, a semiconductor structure has a semiconductor device, a first interconnection layer, and a second interconnection layer. The semiconductor device has a first surface and a second surface opposite to the first surface. The first interconnection layer is disposed on the first surface of the semiconductor device. The first interconnection layer includes a first seal ring adjacent to edges of the first surface. The second interconnection layer is disposed on the second surface of the semiconductor device. The second interconnection layer includes a second seal ring adjacent to edges of the second surface.

According to some embodiments, a semiconductor manufacturing process includes the following steps. A wafer having at least one semiconductor device is provided. The at least one semiconductor device has a first surface and a second surface, and a first seal ring is disposed on the first surface of the at least one semiconductor device and adjacent to edges of the first surface. A second seal ring is formed on the second surface of the at least one semiconductor device, wherein the second seal ring is adjacent to edges of the second surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
 a semiconductor device having a first surface and a second surface opposite to the first surface;
 a first seal ring, disposed on the first surface of the semiconductor device and adjacent to edges of the first surface; and
 a second seal ring, disposed on the second surface of the semiconductor device and adjacent to edges of the second surface.

2. The semiconductor structure as claimed in claim 1, further comprising:
 a trench in the second surface of the semiconductor device, wherein the second seal ring is disposed on the trench.

3. The semiconductor structure as claimed in claim 1, wherein the second seal ring is a single seal ring loop pattern.

4. The semiconductor structure as claimed in claim 1, wherein the second seal ring is a multiple seal ring loop pattern, the multiple seal ring loop pattern includes at least one seal ring loop surrounding another seal ring loop.

5. The semiconductor structure as claimed in claim 3, wherein the second seal ring further includes a plurality of corner structures, disposed on the second surface of the semiconductor device and at corners of the semiconductor device, wherein the corner structures are formed as a same layer as the second seal ring and are disposed between the corners of the semiconductor device and the single seal ring loop pattern of the second seal ring.

6. The semiconductor structure as claimed in claim 4, wherein the second seal ring further includes a plurality of corner structures, disposed on the second surface of the semiconductor device and at corners of the semiconductor device, wherein the corner structures are formed as a same layer as the second seal ring and are disposed between the corners of the semiconductor device and the multiple seal ring loop pattern of the second seal ring.

7. The semiconductor structure as claimed in claim 1, wherein the second seal ring comprises at least one conductive layer and at least one dielectric layer.

8. A semiconductor structure comprising:
a semiconductor device having a first surface and a second surface opposite to the first surface;
a first interconnection layer, disposed on the first surface of the semiconductor device, wherein the first interconnection layer comprises a first seal ring adjacent to edges of the first surface; and
a second interconnection layer, disposed on the second surface of the semiconductor device, wherein the second interconnection layer comprises a second seal ring adjacent to edges of the second surface.

9. The semiconductor structure as claimed in claim 8, further comprising:
a trench in the second surface of the semiconductor device, wherein the second seal ring is disposed on the trench.

10. The semiconductor structure as claimed in claim 8, wherein the second seal ring is a single seal ring loop pattern.

11. The semiconductor structure as claimed in claim 8, wherein the second seal ring is a multiple seal ring loop pattern, the multiple seal ring loop pattern includes at least one seal ring loop surrounding another seal ring loop.

12. The semiconductor structure as claimed in claim 10, wherein the second seal ring further includes a plurality of corner structures, disposed on the second surface of the semiconductor device and at corners of the semiconductor device, wherein the corner structures are formed as a same layer as the second seal ring and are disposed between the corners of the semiconductor device and the single seal ring loop pattern of the second seal ring.

13. The semiconductor structure as claimed in claim 11, wherein the second seal ring further includes a plurality of corner structures, disposed on the second surface of the semiconductor device and at corners of the semiconductor device, wherein the corner structures are formed as a same layer as the second seal ring and are disposed between the corners of the semiconductor device and the multiple seal ring loop pattern of the second seal ring.

14. The semiconductor structure as claimed in claim 8, wherein the second seal ring comprises at least one conductive layer and at least one dielectric layer.

15. A semiconductor manufacturing process comprising:
providing a wafer having at least one semiconductor device, wherein the at least one semiconductor device has a first surface and a second surface, and a first seal ring is disposed on the first surface of the at least one semiconductor device and adjacent to edges of the first surface;
forming a second seal ring on the second surface of the at least one semiconductor device, wherein the second seal ring is adjacent to edges of the second surface.

16. The semiconductor manufacturing process as claimed in claim 15, wherein the step of forming the second seal ring comprises:
forming a conductive layer on the second surface; and
patterning the conductive layer to form a second seal ring.

17. The semiconductor manufacturing process as claimed in claim 15, wherein prior to the step of forming the second seal ring on the second surface comprises:
forming a trench in the second surface of the semiconductor device.

18. The semiconductor manufacturing process as claimed in claim 15, wherein the patterning of the conductive layer to form the second seal ring forms a plurality of corner structures disposed on the second surface and at corners of the semiconductor device, wherein the corner structures are formed as a same layer as the second seal ring and are formed between the corners of the semiconductor device and the second seal ring.

19. The semiconductor manufacturing process as claimed in claim 15, wherein the second seal ring is a multiple seal ring loop pattern, the multiple seal ring loop pattern includes at least one seal ring loop surrounding another seal ring loop.

20. The semiconductor manufacturing process as claimed in claim 19, wherein the patterning of the conductive layer to form the second seal ring forms a plurality of corner structures disposed on the second surface and at corners of the semiconductor device, wherein the corner structures are formed as a same layer as the second seal ring and are formed between the corners of the semiconductor device and the multiple seal ring loop pattern of the second seal ring.

* * * * *